United States Patent [19]
Hongo

[11] Patent Number: 5,479,644
[45] Date of Patent: Dec. 26, 1995

[54] MICROCOMPUTER HAVING AN OSCILLATOR PART WITH VARIABLE DRIVING ABILITY

[75] Inventor: Katsunobu Hongo, Itami, Japan

[73] Assignee: Mitsubishi Denki Kabushiki Kaisha, Tokyo, Japan

[21] Appl. No.: 290,571

[22] Filed: Aug. 15, 1994

[30] Foreign Application Priority Data

Aug. 30, 1993  [JP]  Japan ................................ 5-214117

[51] Int. Cl.⁶ ................................................ G06F 1/08
[52] U.S. Cl. ..................... 395/550; 395/750; 364/270.2; 364/273.1
[58] Field of Search ............................. 395/550, 750; 364/270.2, 273.1

[56] References Cited

U.S. PATENT DOCUMENTS 5,155,451  10/1992  Gladden et al. ...................... 331/1 A Primary Examiner—Kevin A. Kriess
Assistant Examiner—Dennis M. Butler
Attorney, Agent, or Firm—Lowe, Price, LeBlanc & Becker

[57] ABSTRACT

A microcomputer having a frequency divider for dividing, at multiple stages, the frequency of the clock generated by an oscillator circuit, a selector for selecting from among the resulting divided frequency clocks, a counter for counting the divided frequency clock selected, a switch for changing the driving ability of the oscillator circuit, and a select bit in which data on selecting the on or off control over the switch is written, wherein the driving ability of the oscillator circuit is set large in initiating oscillation and low after initiating the supply of its internal clock, independently of the program.

8 Claims, 18 Drawing Sheets

MICROCOMPUTER HAVING AN OSCILLATOR PART WITH VARIABLE DRIVING ABILITY

BACKGROUND OF THE INVENTION

1. Field of the Invention

The present invention relates to a microcomputer and, more particularly, to a microcomputer internally provided with an oscillator circuit, wherein the driving ability of the oscillator circuit can be changed.

2. Description of Related Art in a single-chip microcomputer internally provided with an oscillator circuit, the driving ability of the oscillator circuit can be changed by rewriting the content of a register under the control of a CPU, so as to reduce power consumption and an unnecessary emission by oscillation.

FIG. 1 is a block diagram showing the constitution of a conventional microcomputer of this type. Together with a ceramic-resonator or a crystal oscillator, a capacitor for oscillation and the like are connected to the microcomputer. The microcomputer comprises a clock input terminal 1 to which a clock is to be inputted and a clock output terminal 2 from which the clock is to be outputted. The clock input terminal 1 is connected to one input terminal of each of NAND circuits 3 and 4.

An interrupt request signal (hereinafter referred to as an interrupt signal) INT is inputted to one input terminal of an OR circuit 18, while a reset signal RST is inputted to the other input terminal thereof. The output terminal of the OR circuit 18 is connected to the set terminal S of an RS flip-flop 9. To the reset terminal R of the RS flip-flop 9 inputted is an oscillation stop signal STP, while the output terminal Q of the flip-flop 9 is connected to the other input terminal of each of the NAND circuits 3 and 4. The output terminal Q of the flip-flop 9 is connected to the other input terminals of the NAND circuits 3 and 4. The output terminal of the NAND circuit 4 is connected via a switch 11 to the input side of a frequency divider 5 for dividing the frequencies of the clocks from the NAND circuits 3 and 4. The output terminal of the NAND circuit 4 is also connected to the clock output terminal 2, to the output terminal of the NAND circuit 3, and to one input terminal of an AND circuit 10.

The output side of the frequency divider 5 is connected to the input side of a selector 6 for selecting a divided frequency clock from the frequency divider 5. The output side of the selector 6 is connected to the input side of a counter 7, which also serves as a watch dog timer. The output side of the counter 7 is connected to one input terminal of an OR circuit 12. To the other input terminal of the OR circuit 12 inputted is a reset signal RST. The output terminal of the OR circuit 12 is connected to the set terminal S of an RS flip-flop 8. To the reset terminal R of the flip-flop 8 inputted is the oscillation stop signal STP.

The output terminal Q of the flip-flop 8 is connected to the other input terminal of the AND circuit 10 and to one input terminal of an OR circuit 14 via an inverter 16. The AND circuit 10 outputs an internal clock i to be given to the CPU (not shown) and the like. To the other input terminal of the OR circuit 14 inputted is the content of a select bit 20 composed of a register in which an instruction to select the divided frequency clock from the frequency divider 5 is written. The output from the OR circuit 14 is given to the selector 6. A select bit 21 is composed of a register for controlling the driving ability of the oscillator circuit by turning the switch 11 on and off. The content s of the select bit 21 is given to the switch 11. The NAND circuits 3 and 4 and switch 11 constitute an oscillator circuit part 50.

FIG. 2 is a block diagram showing specific constitutions of the frequency divider 5, selector 6, and counter 7 of FIG. 1. The frequency divider 5 consists of half frequency divider circuits 101, 102, 103 . . . 105 . . . 109 for halving the frequency of the clock inputted from the clock output terminal 2, which are connected in series. From the half frequency divider circuits 101, 102, 103 . . . 105 . . . 109 are outputted clocks $f_2$, $f_4$, $f_8$ . . . $f_{32}$ . . . $f_{512}$ with halved frequencies.

The selector 6 consists of: transfer gates 161 and 162 the output sides of which are connected in common; a buffer 163 the input side of which is connected to the output sides of the transfer gates 161 and 162; and an inverter 164 the input side of which is connected to the gate of an N-channel transistor of the transfer gate 161 and to the gate of a P-channel transistor of the transfer gate 162 and the output side of which is connected to the gate of a P-channel transistor of the transfer gate 161 and to the gate of an N-channel transistor of the transfer gate 162. The input side of the transfer gate 161 (162) is connected to the output side of the half frequency divider circuit 105 (109). The gate of the N-chan/el transistor of the transfer gate 161 and the gate of the P-channel transistor gate of the transfer gate 162 are connected to the output terminal of the OR circuit 14.

The counter 7 consists of: half frequency divider circuits 201, 202 . . . 211, 212, which are connected in series and each of which constitutes a counter that increments itself; and a reset control circuit 170 for resetting the half frequency divider circuits 201, 202 . . . 211, 212. The input side of the half frequency divider circuit 201 is connected to the output side of the buffer 163. If the counted value reaches a specified value, a signal h (g) is outputted from the half frequency divider circuit 202 (211). An overflow signal f outputted from the half frequency divider circuit 212 is inputted to the reset control circuit 170. To the reset control circuit 170 inputted are a reset signal RST, an oscillation stop signal STP, and a write signal WRT.

FIG. 3 is a block diagram showing a specific constitution of the oscillator circuit part 50. One input terminal of a NAND circuit 57, to which the output p from the flip-flop 9 is inputted, is connected to the gate of a transistor 41 interposed between a power source $V_D$ and the clock output terminal 2, to the input side of an inverter 59, and to the gate of a transistor 56. The output side of the inverter 59 is connected to the gate of a transistor 53. The output side of an inverter 49, to which a signal s from the select bit 21 and a signal sa from an AND circuit 13 are inputted, is connected to the other input terminal of the NAND circuit 57. The output terminal of the NAND circuit 57 is connected to the gate of a transistor 52 and to the input side of an inverter 58. The output side of the inverter 58 is connected to the gate of a transistor 55.

A series circuit consisting of the transistors 52 and 55 and a series circuit consisting of the transistors 53 and 56 are connected in parallel. The source sides of the transistors 52 and 53 are connected to the power source $V_D$ via a transistor 51. The drain sides of the transistors 55 and 56 are connected to the ground via a transistor 54. The joint between the transistors 52 and 55 and the joint between the transistors 53 and 56 are connected in common to the joint between a transistor 41 and the clock output terminal 2. The gates of the transistors 51 and 54 are connected in common to the clock input terminal 1.

FIG. 4 is a block diagram showing the single-chip microcomputer to which an external oscillator and the like are connected. Between the clock input terminal 1 and clock output terminal 2 provided in a microcomputer 310 mounted is a parallel circuit consisting of a resistance 312 and, e.g., a ceramic resonator 311. The clock input terminal 1 and clock output terminal 2 are grounded via capacitors 313 and 314, respectively.

FIG. 5 is a block diagram showing a specific constitution of the select bits 20 and 21. A data bus 65 is connected to the input terminal D of a D flip-flop 71, the output terminal Q of which is connected to the data bus 65 via an output buffer 75. The content s written in the select bits 20 and 21 is outputted from the output terminal Q of the flip-flop 71. An address bus 66 is connected to the input side of an address decoder 73, the output side of which is connected to one input terminal of each of AND circuits 74 and 76. The output terminal of the AND circuit 74 is connected to the clock terminal CK of the flip-flop 71. A write signal line 67 is connected to the other input terminal of the AND circuit 74. A read signal line 68 is connected to the other input terminal of the AND circuit 76, the output terminal of which is connected to the output control terminal of the buffer 75. A reset signal line 69 is connected to the reset terminal RS of the flip-flop 71.

Next, the operation of the microcomputer will be described with reference to FIG. 6 showing a timing chart of signals to individual parts. In a state in which a specified source voltage is supplied to the microcomputer 310 and the reset signal RST at the L level is inputted thereto, each of the flip-flops 8 and 9 is in the set state, so that the outputs p and a from the flip-flops 8 and 9 are at the H level. The select bits 20 and 21 are reset, as shown in FIGS. 6(E) and 6(H), so that the counter 7 is reset. In a state in which the select bit 21 is reset, the switch 11 is on and therefore the output p from the flip-flop 9 is at the H level. As a result, each of the NAND circuits 3 and 4 is brought into the active state and inverts the clock from the clock input terminal 1, so that the inverted clock is outputted to the clock output terminal 2.

Since the ceramic resonator 311, capacitors 313 and 314, and the like are connected between the clock input terminal 1 and clock output terminal 2, as shown in FIG. 4, oscillating operation is performed so that the clock shown in FIG. 6(B), which is composed of sinusoidal voltages having opposite phases, can be obtained at each of the clock input terminal 1 and clock output terminal 2. The cycle, i.e., oscillating frequency of the clock is determined by the oscillating characteristic of the ceramic resonator 311. The clock thus generated is inputted to the frequency divider 5. After the initiation of the oscillating operation, the frequency divider 5 continues to divide the frequency of the inputted clock one after another by means of the half frequency divider circuits 101, 102, 103 . . . 105.

Here, if it is assumed that the frequency of the clock at the clock output terminal 2 is $f_{out}$, the frequency $f_2$ of a divided frequency clock outputted from the half frequency divider circuit 101 is $f_{out}/2$, and the frequency $f_8$ of the divided frequency clock outputted from a half divider circuit 103 becomes $f_{out}/8$. Since the output a from the flip-flop 8 is at the H level and the select bit 20 is at the L level, as shown in FIG. 6(C), the transfer gate 162 of the selector 6 is turned on, while the transfer gate 161 of the selector 6 is turned off, so that a divided frequency clock $f_{512}$ outputted from the half divider circuit 109 is selected, as shown in FIG. 6(G). The divided frequency clock $f_{512}$ selected is inputted to the counter 7 via the buffer 163.

In the reset state, the counter 7 is always reset to "0" ($000_{16}$). If the reset signal is switched to the H level at a time $t_0$ for reset cancellation, the counter 7 initiates the counting of the divided frequency clock $f_{512}$. The counter 7 is used as a supervisory timer (watch dog timer) for detecting the run away of the CPU and outputting an interrupt signal, except for the period during which oscillation is stable, i.e., the period during which the oscillating operation, which will be described later, is at a halt and except for the period from the initiation of the oscillating operation to the initiation of the supply of the internal clock.

Since the output a from the flip-flop 8 is at the H level, the AND circuit 10 is brought into the active state and supplies the clock, outputted to the clock output terminal 2, to a specified circuit such as the CPU (not shown) as an internal clock i. The microprocessor can be arranged so that a divided frequency clock x, having the same frequency as that of the divided frequency clock $f_2$ outputted from the half frequency divider circuit 101 of FIG. 2, is inputted to the AND circuit 10, instead of the clock from the clock output terminal 2.

After reset cancellation, the CPU in the microcomputer 301 is activated by the internal clock i so as to execute a specified program. The counter 7 counts up from the initial value $000_{16}$, as described above, and if the counted value reaches a specified value and causes an over flow, it outputs the over flow signal f. In the case where the counter 7 is used as a supervisory timer for the CPU, a non-maskable interrupt is caused by the over flow signal f, so that the counter 7 is reset by the program, before the over flow of the counted value occurs, so as to prevent the above non-maskable interrupt, thus returning the counted value to the initial value $000_{16}$.

The counter 7 is reset by the reset control circuit 170 in response to the reset signal RST, write signal WRT to the counter 7, oscillation stop signal STP according to an oscillation stop instruction which will be described later, and over flow signal f. The select bit 20 is for selecting either of the divided frequency clocks $f_{32}$ and $f_{512}$ to be counted by the counter 7. If the divided frequency clock $f_{512}$ was selected after resetting, the divided frequency clock $f_{32}$ is selected by writing "1" in the select bit 20. After the activation of the CPU, the internal clock with a frequency appropriate for the operation of the CPU is selected to be supplied to the CPU.

Under such conditions, the switch 11 is on and the NAND circuits 3 and 4 combine to function as an oscillator circuit. The driving ability of the oscillator is large, because it equals to the combined outputs from the NAND circuits 3 and 4.

After supplying the power source voltage, to reduce the time period from the initiation of the oscillating operation to the stabilization of oscillation, it is necessary to increase the driving ability as described above. If the driving ability is large, however, the current consumed in the NAND circuits 3 and 4 is increased.

Since the physical circuit of the oscillator circuit part 50 is as shown in FIG. 3, the output p from the flip-flop 9 is at the L level in each oscillation stopped state, while the P-channel transistors 52 and 53 and N-channel transistors 55 and 56 are turned off and the P-channel transistor 41 is turned on. Consequently, the clock output terminal 2 shifts to the H level, thereby realizing such a state as if the NAND circuits 3 and 4 of FIG. 1 actually existed.

Once the oscillating operation is stabilized, the driving ability can be reduced. Since a smaller driving ability consumes less current, the driving ability of the oscillator circuit is switched by turning the switch 11 off. In switching the driving ability, the CPU activated by the internal clock i writes "1" in the select bit 21, with the result that the content s of the select bit 21 shifts to the H level, thereby turning the switch 11 off. The driving ability of the oscillator circuit, which depends solely on the NAND circuit 3 in this state, becomes small accordingly. After turning on the power, in consideration of the fact that the reset signal RST is not generated, the CPU writes "0" in the select bit 21 before the oscillation stop signal STP is outputted so that the select bit 21 is brought into the reset state when the power is on (in all ordinary applied system, the select bit 21 is reset by an external IC for resetting immediately after turning on the power).

The program executed by the CPU contains the oscillation stop instruction for stopping the oscillating operation of the oscillator circuit. Below, a description will be given to the operation of the microcomputer when the oscillation stop instruction is to be executed. After writing "0" in the select bit 21, as shown in FIG. 6(H), if the oscillation stop signal STP serving as the oscillation stop instruction is generated at a time $t_1$, each of the flip-flops 9 and 8 is reset, so that the output p shifts to the L level as shown in FIG. 6(C), while the output a shifts to the L level. When the output p shifts to the L level, the outputs from the NAND circuits 3 and 4 are fixed to the H level, thus stopping the oscillating operation, as shown in FIG. 6(B). When the output a shifts to the L level, as shown in FIG. 6(C), the output from the AND circuit 10 is fixed to the L level, so that the internal clock i is halted at the L level as shown in FIG. 6(D), thus stopping the supply of the internal clock i. On the other hand, the counter 7 is reset.

To return from the oscillation stopped state subsequently, the reset signal or interrupt signal can be used. Since the description has already given to the case where the reset signal RST is used, a description will be given to the case where the interrupt signal INT is used to achieve a return from the oscillation stopped state. In the oscillation stopped state, if an input terminal for the interrupt signal (not shown) is switched to the L level at a time $t_2$, the interrupt signal INT at the H level is generated. As a result, the output from the OR circuit 18 shifts to the H level, which in turn sets the flip-flop 9, so that the output p from the flip-flop 9 shifts to the H level. The NAND circuits 3 and 4 are thereby brought into the active state, so that the oscillator circuit part 50 resumes the oscillating operation. As described above, since "0" has been written in the select bit 21 prior to the outputting of the oscillation stop signal STP, the switch 11 is turned on as well as the NAND circuit 4 functions effectively, so that the driving ability of the oscillator circuit becomes large.

As shown in FIG. 6(B), the flip-flop 8 has been in the same state since it was reset by the oscillation stop signal STP, which stopped the oscillating operation, and its output a remains at the L level. The output from the OR circuit 14 is thereby switched to the H level and the selector selects the frequency divided clock $f_{32}$, so that the supply of the internal clock i, which is fixed to the L level, is stopped. In this state, the frequency of the clock from the clock output terminal 2 is divided by the frequency divider 5 and the divided frequency clock $f_{32}$, which has been selected by the selector 6, is inputted to the counter 7, so as to be counted. The counter 7 then initiates the counting from the initial value $000_{16}$.

It is assumed that the oscillating frequency of the clock to be counted is represented by $f_{(XIN)}$. If the frequency of the clock is $f_{(XIN)}$ at the time when oscillation is initiated, the counter 7 outputs the over flow signal f at the H level at a time $t_3$ after $1/f_{(XIN)} \times 32 \times 2048$ seconds elapsed, as shown in FIG. 6(F). The over flow signal f sets the flip-flop 8 so that its output a shifts to the H level, which brings the AND circuit 10 into the active state, thus initiating the supply of the internal clock i from the time $t_3$, as shown in FIG. 6(D).

On the other hand, the output from the inverter 16 shifts to the L level, while the selector 6 is controlled only by the content of the select bit 20. Thus, by measuring the time period from the initiation of the oscillating operation to the initiation of the supply of the internal clock i by means of the counter 7, the voltage level immediately after initiating oscillation and the clock with an unstable oscillating frequency are not supplied as the internal clock i to a specified circuit, such as the CPU. If "1" is not written in the select bit 20, a signal at the L level is given from the OR circuit 14 to the selector 6, so that the selector 6 is switched to select the divided frequency clock $f_{512}$, which is lower in frequency than the divided frequency clock $f_{32}$.

If "1" is written in the select bit 21 at a time $t_4$ by the CPU which is operated by the internal clock i supplied thereto, for example, the content s of the select bit 21 shifts to the H level, as shown in FIG. 6(H), and the switch 11 is turned off, so that the driving ability of the oscillator circuit becomes small. If "1" is written in the select bit 20 at a time $t_5$ by the CPU, the content of the select bit 20 shifts to the H level, as shown in FIG. 6(E), which is then given to the selector 6, so that the divided frequency clock $f_{32}$ is selected as shown in FIG. 6(G). Accordingly, the internal clock i with a different frequency is properly selected for operating the CPU.

If "0" is written in the select bit 21 (reset) at a time $t_6$, on the other hand, the switch 11 is turned on and the driving ability of the oscillator circuit becomes large, as shown in FIG. 6(I). The changes at times $t_8$, $t_9$, and $t_{10}$ after the generation of the oscillation stop signal STP at $t_7$ become similar to the changes at the times $t_2$, $t_3$, and $t_4$. If "1" is written in the select bit 21 at a time $t_{10}$, the switch 11 is turned off and the driving ability of the oscillator circuit becomes small, as shown in FIG. 6(I). In the case where the driving ability is small, as described above, if the oscillation stop signal STP is generated at a time $t_{12}$ so as to stop the oscillating operation and then the interrupt signal INT is generated at a time $t_{13}$, it follows that the oscillating operation is initiated with the driving ability being small, so that it requires a long period of time for oscillation to be stabilized. In some cases, an oscillation does not occur at all.

Next, a description will be given to the operation of writing data in select bits 20 and 21 with reference to FIGS. 5 and 7. If the CPU decodes an instruction to write data in the select bit 21, it outputs the address $A_i$ of the select bit 21 shown in FIG. 7(B) to the address bus 66, data $D1_i$ shown in FIG. 7(C) to the data bus 65, and a write signal WR. Then, the address decoder 73 decodes the address $A_i$ and switches the output A from the address decoder 73 to the H level, as shown in FIG. 7(E). The AND circuit 74 carries out the logical product between the output A and the write signal WR and outputs a write signal W to the clock terminal CK of the flip-flop 71, as shown in FIG. 7(F). In response to the write signal W, the flip-flop 71 latches the data on the data bus 65. At the fall of the write signal W, the output level of the flip-flop 71 is changed so as to write "1" or "0" in the select bit 21, in accordance with the content s.

Thus, in the conventional microcomputer, it is necessary to write "0" in the select bit 21 prior to the generation of the oscillation stop signal STP, which is for reducing the current consumed in the oscillator circuit, and to write "1" in the select bit 21 after the supply of the internal clock i, which enabled a return from the state in which the oscillating operation is stopped, so as to provide a large driving ability in initializing the oscillating operation and a small driving ability after oscillation was stabilized and the internal clock was supplied. Therefore, not only the program is intricate due to the necessity for the CPU to give a write instruction, but also oscillation may not be obtained if an error arises in writing in the program such a write instruction. If the oscillating operation is initiated with a small driving ability by mistake, it disadvantageously requires a long period of time for oscillation to be stabilized. In the worst case, an oscillation may not occur at all.

In the case where the oscillating operation is performed with the driving ability being small in a product test on a microcomputer, there is a possibility that an oscillation does not occur when the user uses the microcomputer. This also brings about a problem that a defective product is not detected in the product test, so that there is a possibility that microcomputers which exhibit unstable oscillating operations appear on the consumers, market. Even when an external clock in stable oscillation is inputted to the clock input terminal without using an oscillator, in order to achieve a return from the oscillation stopped state, the internal clock cannot be supplied until the over flow signal is outputted from the counter. Consequently, even when a stable external clock is inputted, a long period of time is required to initiate the supply of the internal clock. Moreover, there is a possibility that the content of the select bit suffers an unexpected change due to a bug in the program, an alien noise, or the like.

SUMMARY OF THE INVENTION

It is therefore an object of the present invention to provide a microcomputer internally provided with an oscillator circuit, wherein the driving ability of the oscillator circuit can automatically be changed after the generation of an oscillation stop signal and after the supply of an internal clock by writing data in a select bit only once after canceling the halting of the oscillating operation.

Another object of the present invention is to provide a microcomputer internally provided with an oscillator circuit wherein, if an external clock is inputted, the time that has elapsed till the initiation of the supply of an internal clock can be reduced.

Still another object of the present invention is to provide a microcomputer internally provided with an oscillator circuit wherein the content of the select bit does not suffer a change resulting from a bug in a program, an alien noise, or the like.

In the microcomputer according to the present invention, the on-off control over a switch for changing the driving ability of the oscillator circuit is accomplished in accordance with the logical AND between the content of the select bit for selecting the on or off state for the switch and a signal for initiating the supply of the internal clock. After the generation of the oscillation stop signal, specified data is written in the select bit. If the logic between the content of the select bit and the signal for initiating the supply of the internal clock is not determined, the switch is turned on so that the driving ability of the oscillator circuit becomes large, thereby initiating the oscillating operation. If the logic between the content of the select bit and the signal for initiating the supply of the internal clock is determined, the switch is turned off so that the driving ability of the oscillator circuit becomes small, thereby initiating the supply of the internal clock. Hence, the driving ability of the oscillator circuit is automatically switched so that it becomes large during the period from the initiation of the oscillating operation to the initiation of the supply of the internal clock and it becomes small after the initiation of the supply of the internal clock.

Moreover, it is possible to select the divided frequency clock having a large frequency to be counted by the counter for counting a divided frequency clock of the oscillated clock. If the counter counts the divided frequency clock having a large frequency, a specified counted value is reached in a short period of time and a signal for initiating the supply of the internal clock is obtained, so that the time that has elapsed till the initiation of the supply of the internal clock is shortened.

Furthermore, the select bit is formed by mask option. If the select bit is formed by mask option, the data stored at the select bit does not suffer a change resulting from a bug in the program, an alien noise, or the like.

The above and further objects and features of the invention will more fully be apparent from the following detailed description with accompanying drawings.

DESCRIPTION OF THE PREFERRED EMBODIMENTS

Figure 1:
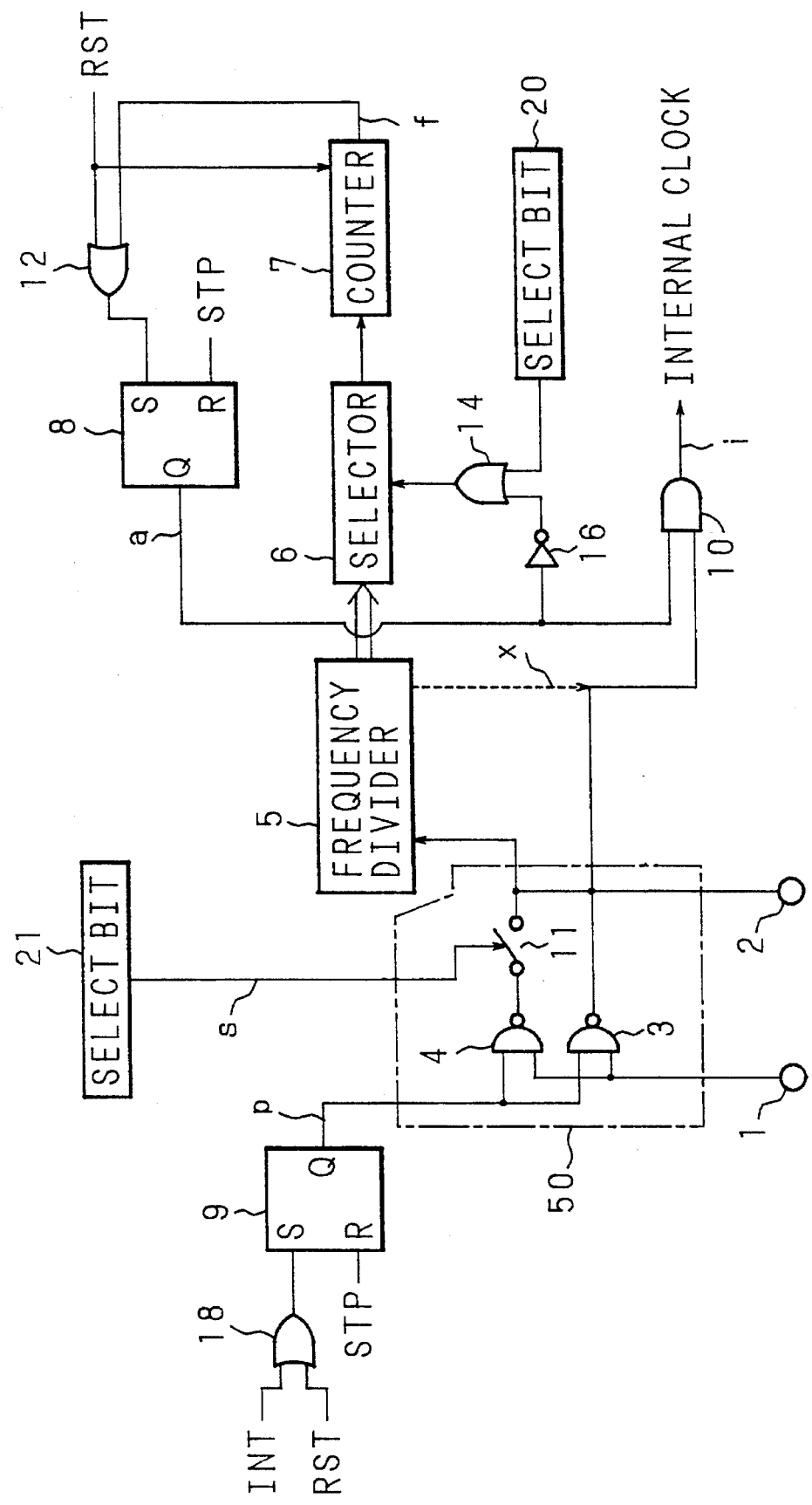
FIG. 1 is a block diagram showing the constitution of a main portion of a conventional microcomputer.

Referring now to the drawings, the embodiments of the present invention will be described below in detail.

Figure 8:
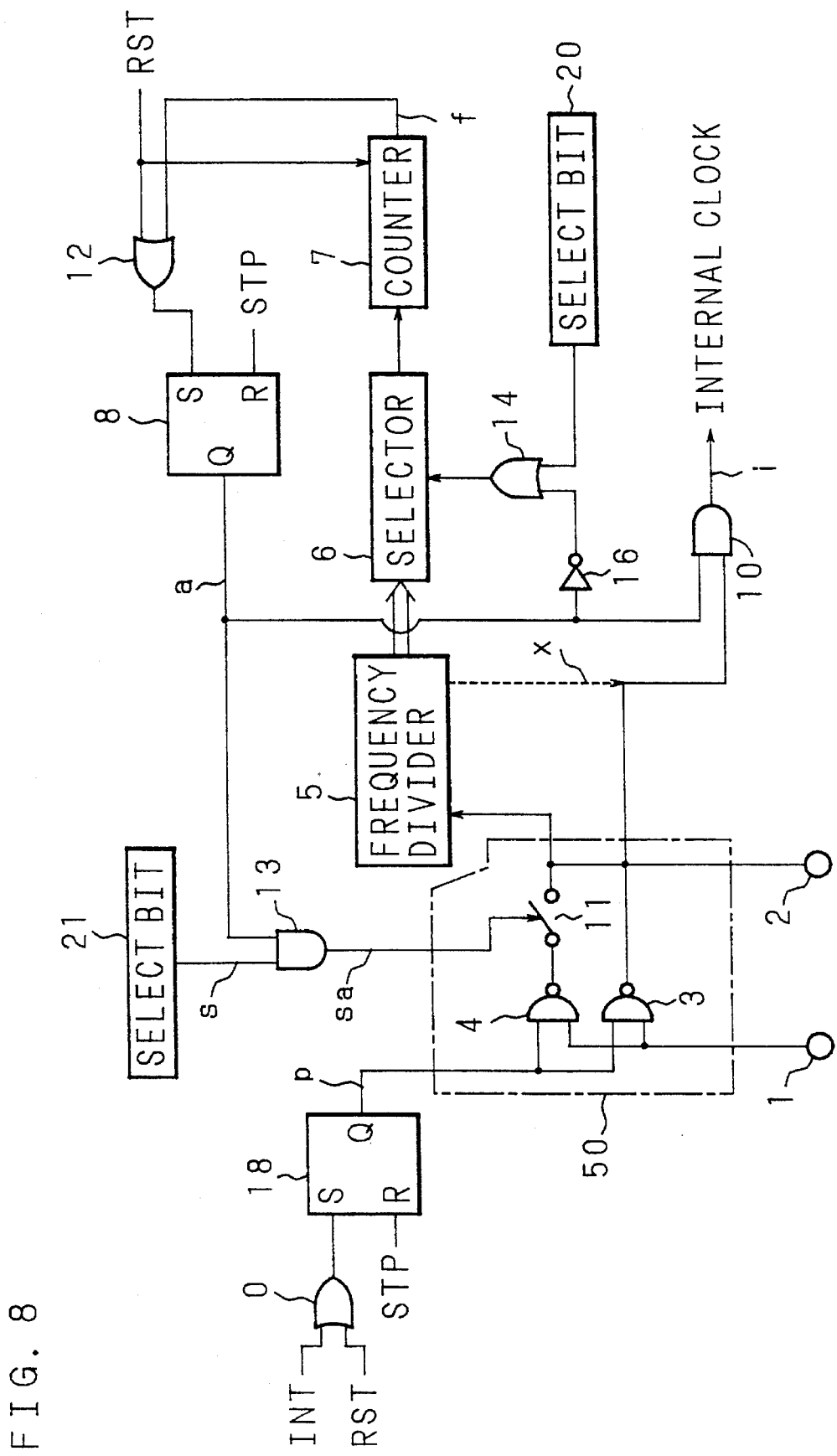
FIG. 8 is a block diagram showing the constitution of a main portion of the microcomputer according to the present invention.

FIG. 8 is a block diagram showing the constitution of a main portion of a microcomputer according to the present invention, to which a capacitor for oscillation together with a ceramic resonator or a crystal oscillator (not shown) are connected. The microcomputer has a clock input terminal 1 to which a clock is inputted and a clock output terminal 2 from which the clock is outputted. The clock input terminal 1 is connected to one input terminal of each of NAND circuits 3 and 4. An interrupt signal INT is inputted to one input terminal of an OR circuit 18, while a reset signal RST is inputted to the other input terminal thereof. The output terminal of the OR circuit 18 is connected to the set terminal S of an RS flip-flop 9. To the reset terminal R of the flip-flop 9 inputted is an oscillation stop signal STP.

The output terminal Q of the flip-flop 9 is connected to the other input terminal of each of the NAND circuits 3 and 4. The output terminal of the NAND circuit 4 is connected to the input side of a frequency divider 5 for dividing the frequencies of the clocks from the NAND circuits 3 and 4 via a switch 11 serving as a driving ability changing means. The output terminal of the NAND circuit 4 is also connected to the clock output terminal 2, to the output terminal of the NAND circuit 3, and to one input terminal of an AND circuit 10. The output side of the frequency divider 5 is connected to the input side of a selector 6 for selecting a divided frequency clock having a different frequency, which is outputted from the frequency divider 5. The output side of the selector 6 is connected to the input side of a counter 7, which is also used as a watch dog timer.

The output side of the counter 7 is connected to one input terminal of an OR circuit 12. To the other input terminal of the OR circuit 12 inputted is the reset signal RST, which is given to the counter 7. The output terminal of the OR circuit 12 is connected to the set terminal S of the RS flip-flop 8. To the reset terminal R of the flip-flop 8 inputted is an oscillation stop signal STP. The output terminal Q of the flip-flop 8 is connected to one input terminal of an AND circuit 13 and to the other input terminal of the AND circuit 10. The output terminal Q of the flip-flop 8 is also connected to one input terminal of an OR circuit 14. The other input terminal of the OR circuit 14 is connected to a select bit 20 which serves as a clock selecting means composed of a register in which data on selecting a divided frequency clock from the frequency divider 5 can be written by a CPU. The output from the OR circuit 14 is given to the selector 6.

A select bit 21 serving as a driving ability selecting means composed of a register for selecting the on or off slate for the switch 11, in which data can be written by the CPU (not shown), is connected to the other input terminal of the AND circuit 13. The output from the AND circuit 13 is given to the switch 11 as an on-off control signal. Here, the NAND circuits 3 and 4 and the switch 11 constitute an oscillator circuit part 50.

Figure 2:
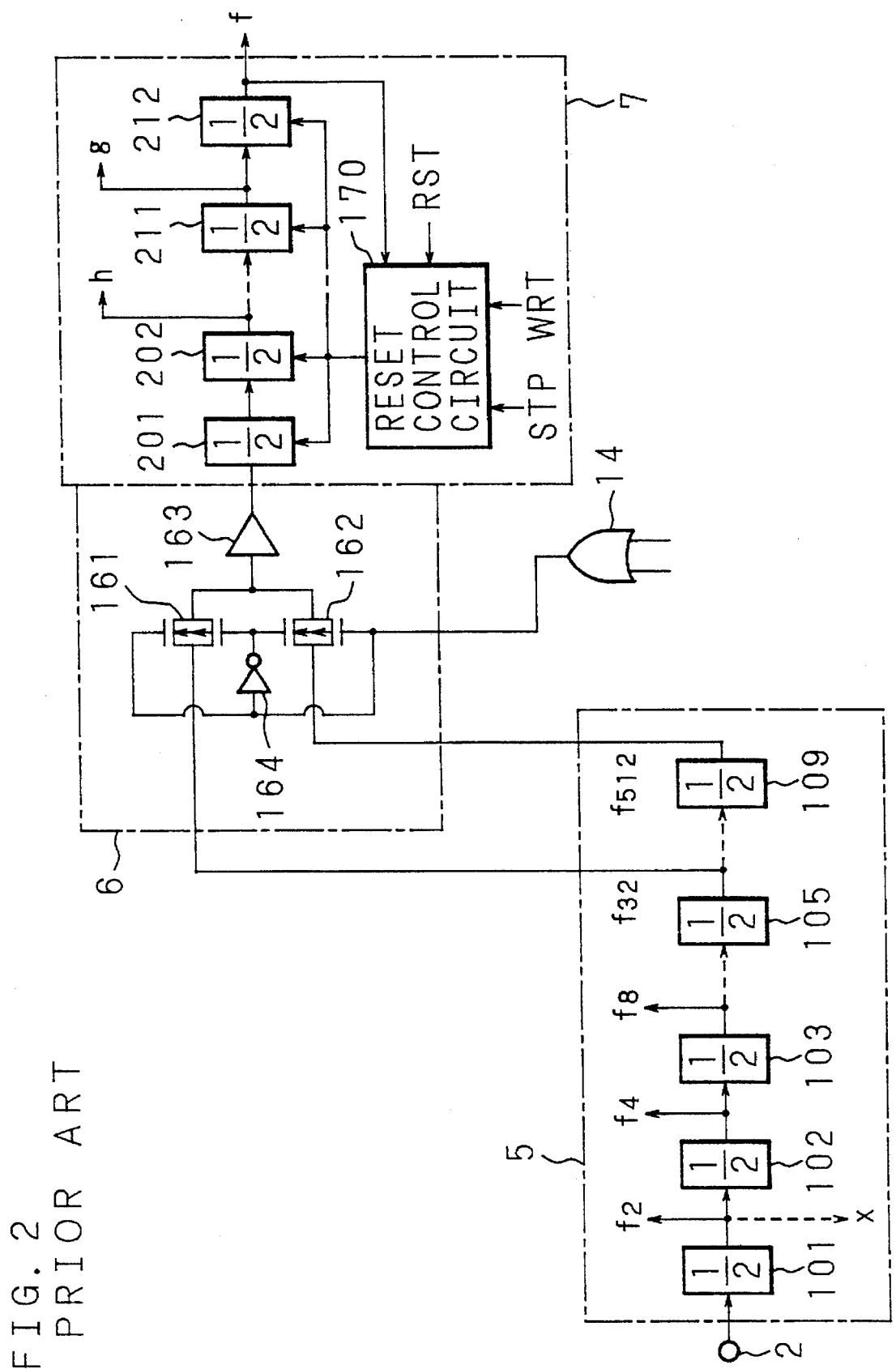
FIG. 2 is a block diagram showing specific constitutions of a frequency divider, selector, and counter.
Figure 3:
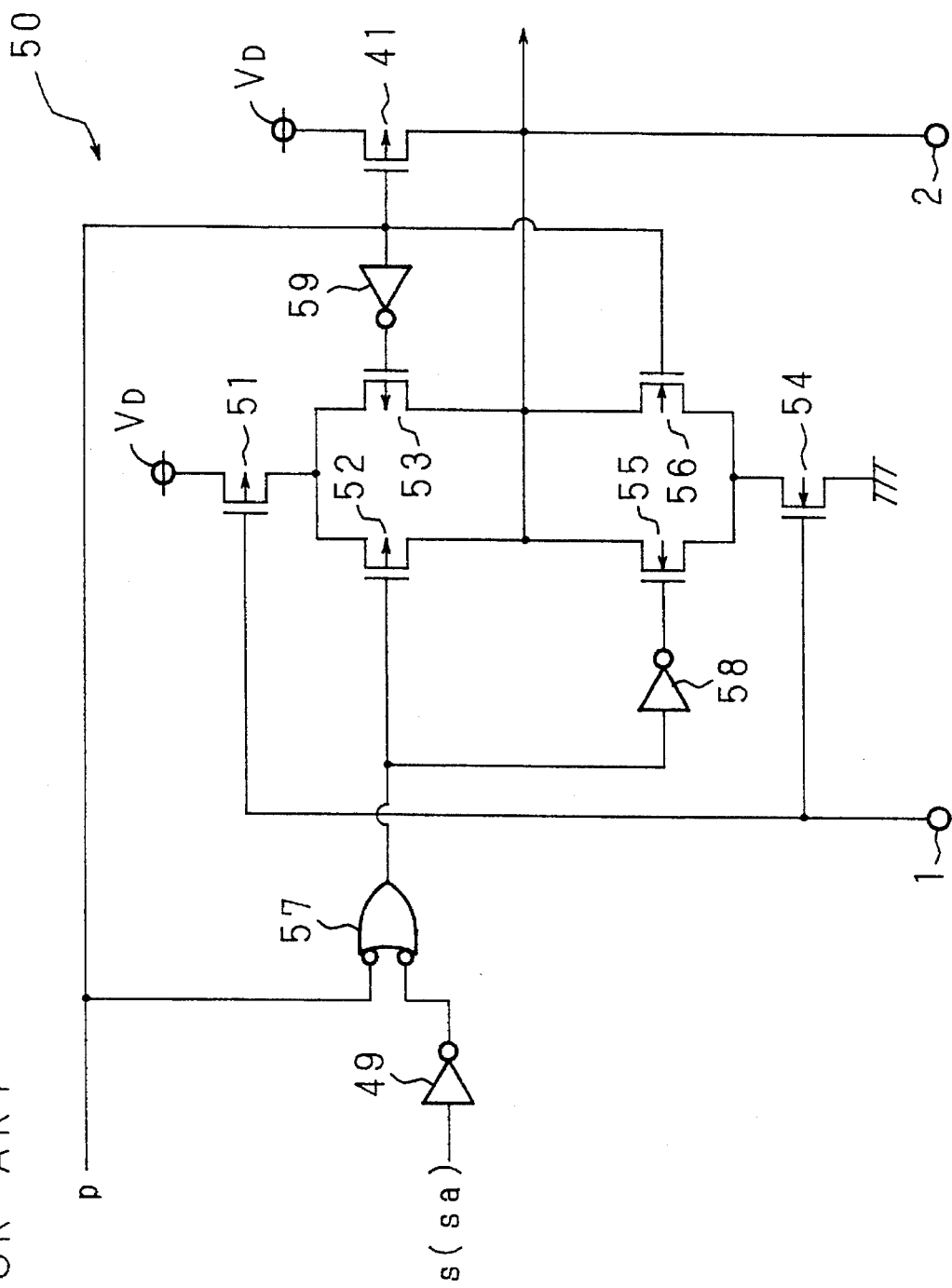
FIG. 3 is a block diagram showing a specific constitution of an oscillator circuit part.
Figure 4:
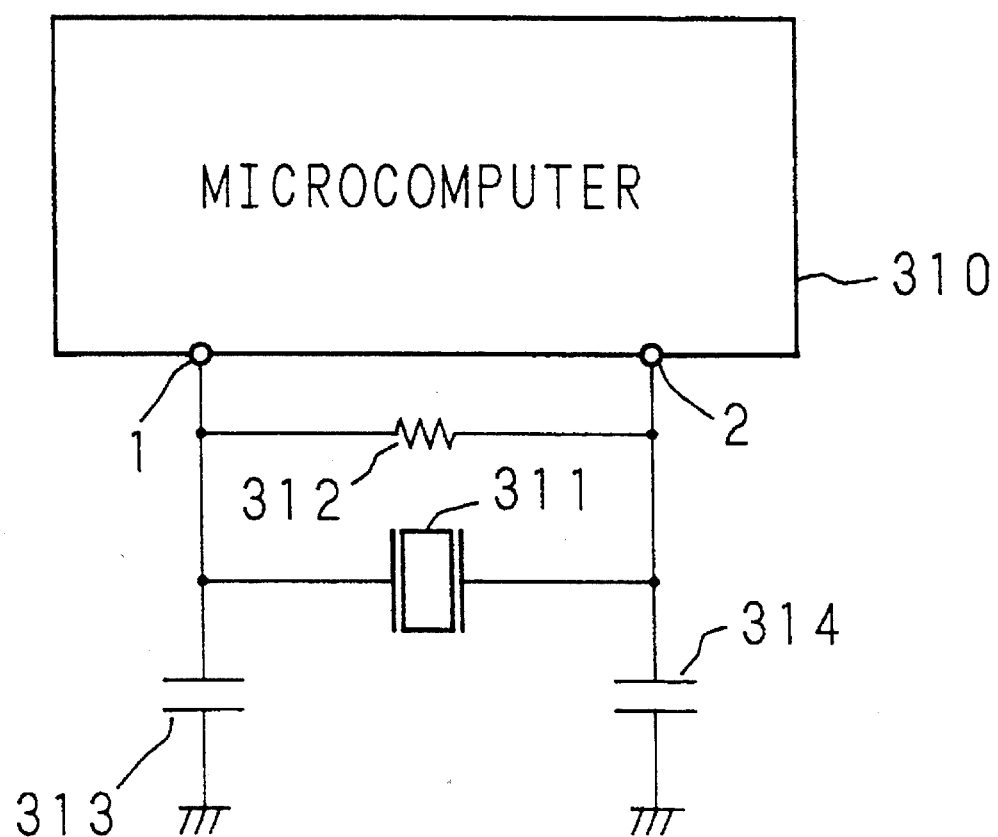
FIG. 4 is a block diagram in which an oscillator is externally connected to the microcomputer of FIG. 1.
Figure 5:
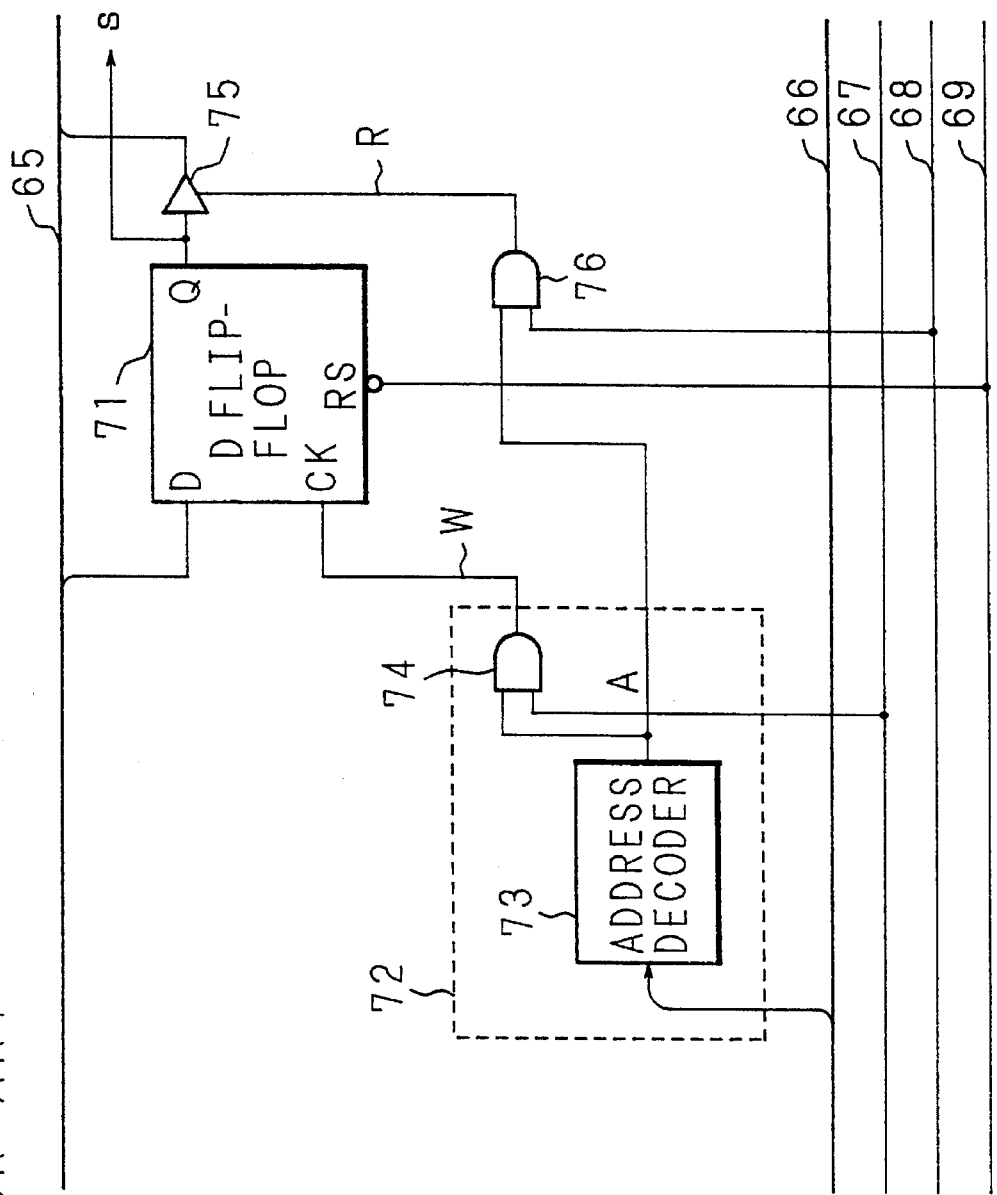
FIG. 5 is a block diagram showing a specific constitution of a select bit.
Figure 6:
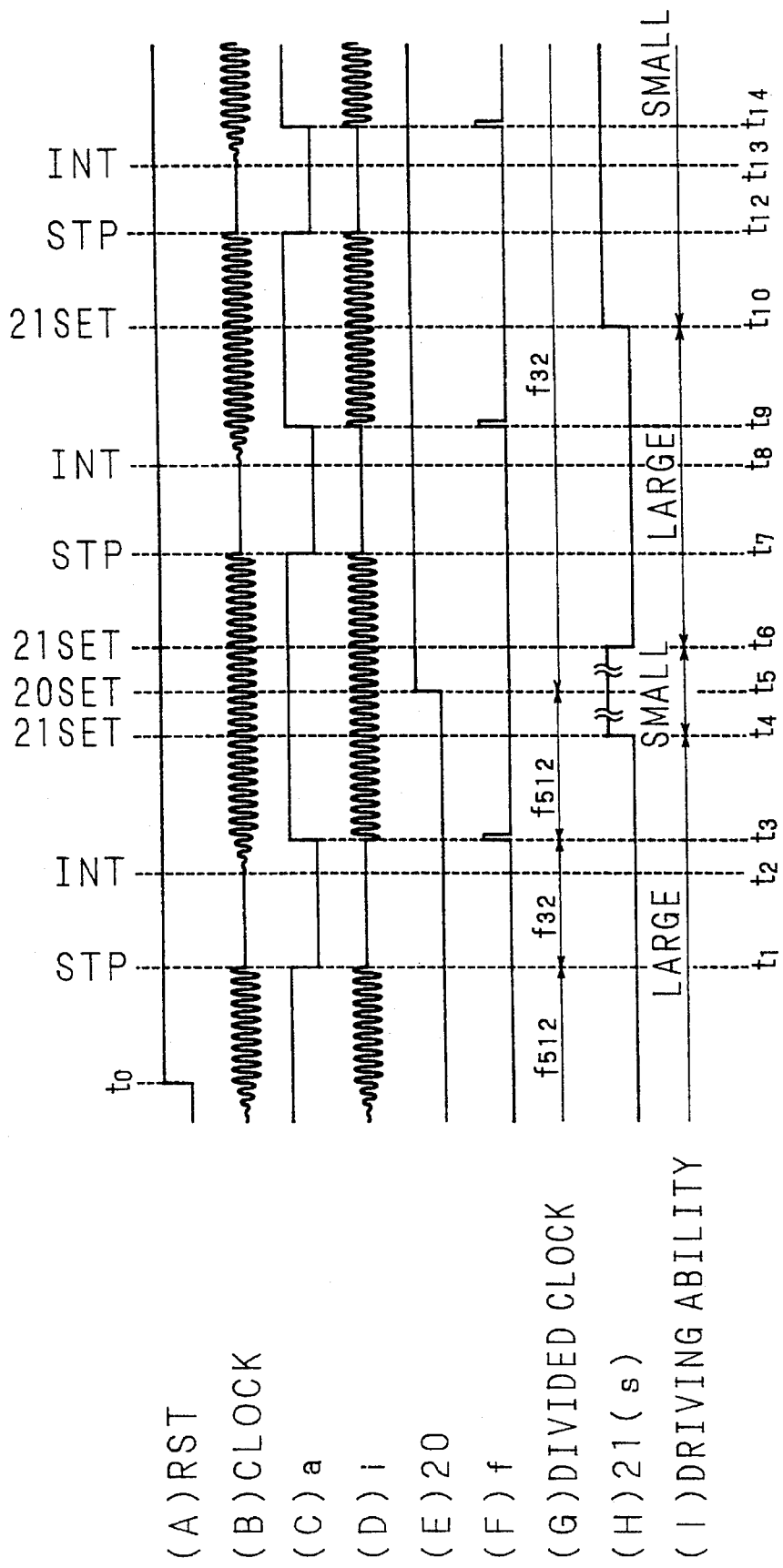
FIG. 6 is a timing chart of signals to individual parts.
Figure 7:
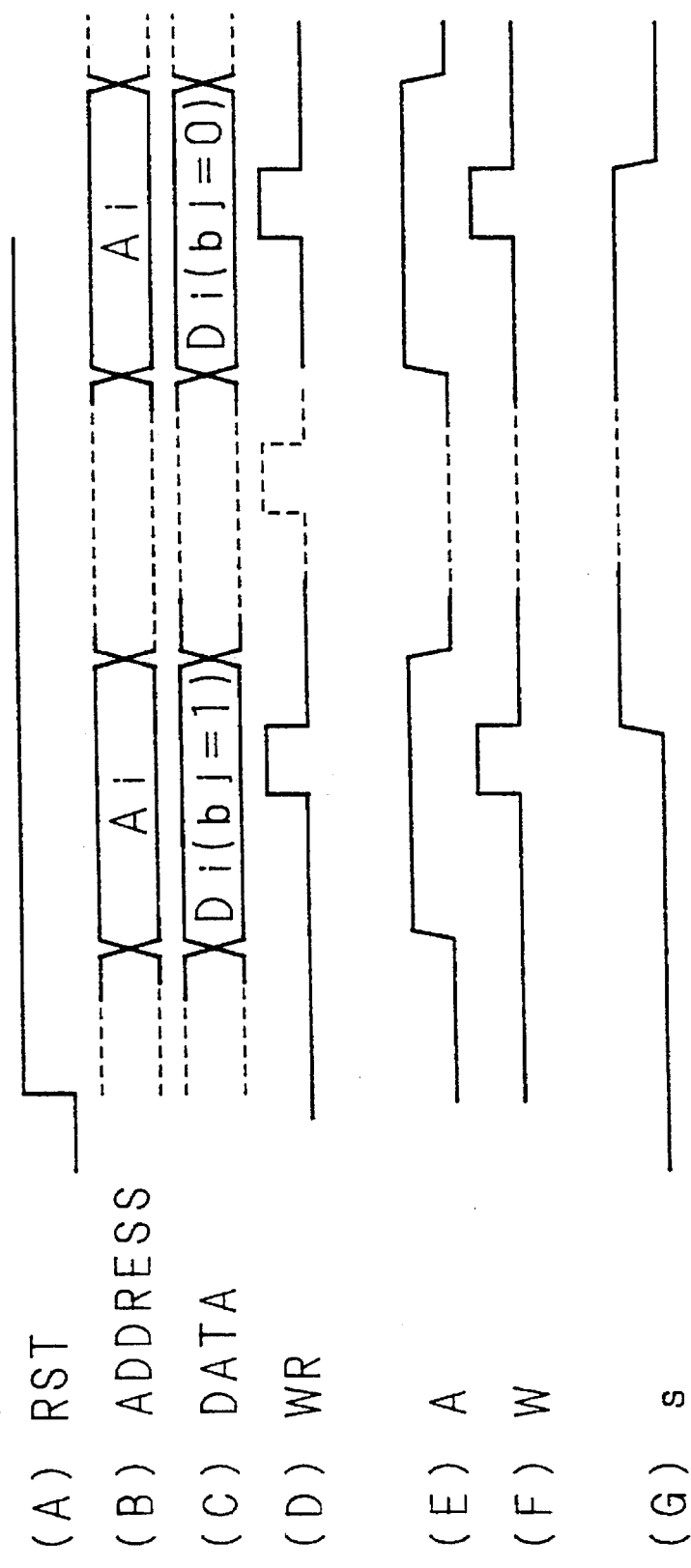
FIG. 7 is a timing chart of individual signals when data is written in the select bit.

The frequency divider 5, the selector 6, and the counter 7 are so constituted as shown in FIG. 2. The oscillator circuit part 50 is so constituted as shown in FIG. 3. If a ceramic resonator 311, e.g., is externally connected between the clock input terminal 1 and clock output terminal 2, the constitution shown in FIG. 4 is adopted. The select bits 20 and 21 are so constituted as shown in FIG. 5. These elements operate similarly to those used in the conventional embodiment described above.

Figure 9:
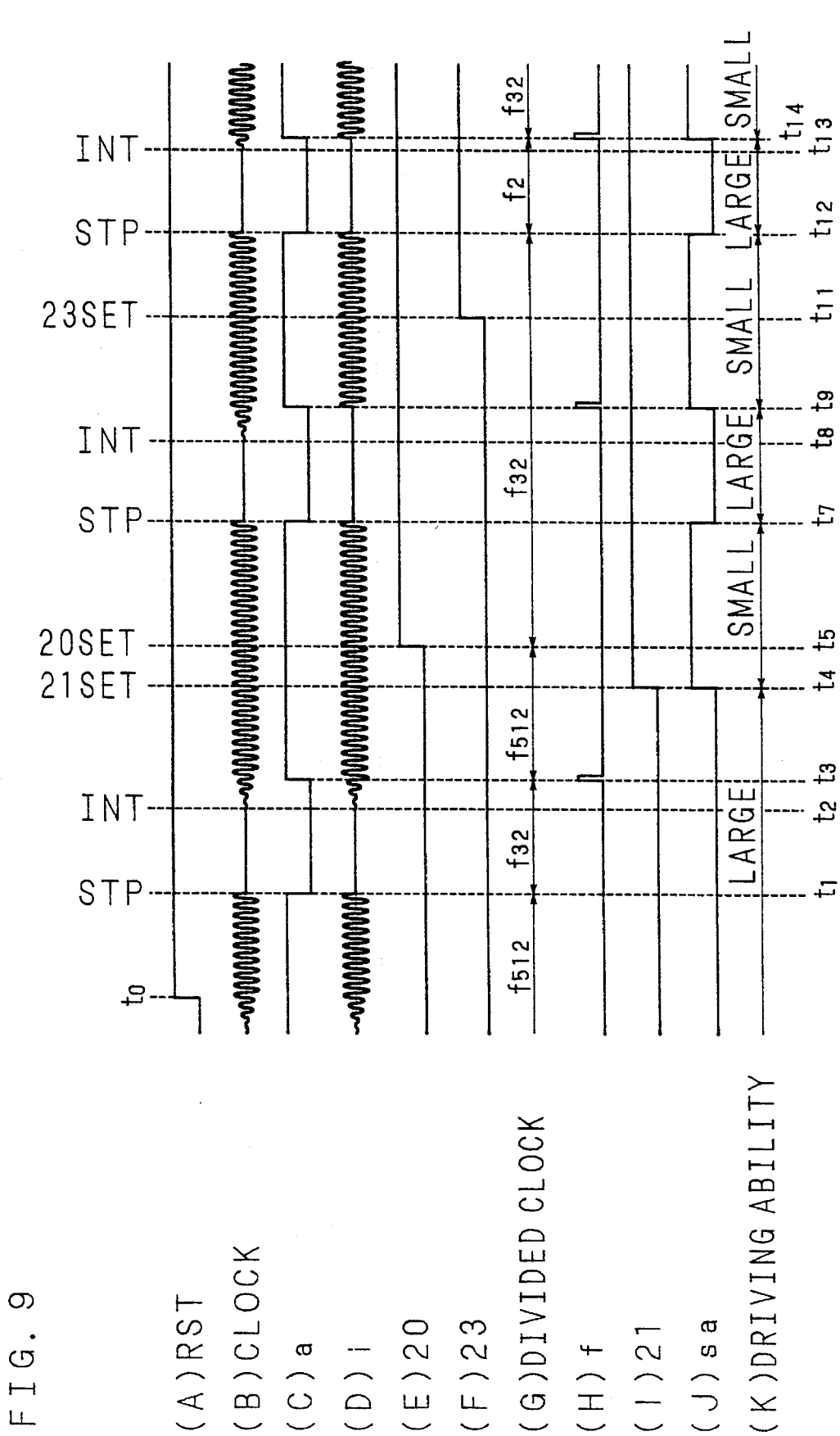
FIG. 9 is a timing chart of signals to individual parts.

Next, the operation of the microcomputer thus constituted will be described with reference to FIG. 9 which shows a timing chart of signals to individual parts.

A specified source voltage is supplied to the microcomputer 310 with the select resonator 311, a resistance 312, and capacitors 313 and 314 being connected thereto. If the reset signal RST is generated, as shown in FIG. 9(A), each of the flip-flops 8 and 9 is brought into the set state so that their outputs p and a shift to the H level, as shown in FIG. 9(C), while the select bits 20 and 21 and the counter 7 are reset. In this state, since the content s of the select bit 21 is at the L level, the output sa from the AND circuit 13 shifts to the L level, while the switch 11 is turned on.

Since the output p from the flip-flop 9 is at the H level, each of the NAND circuits 3 and 4 are brought into the active state so as to invert the clock at the clock input terminal 1 and outpost the inverted clock to the clock output terminal 2. As a result, the ceramic resonator 311 connected between the clock input terminal 1 and clock output terminal 2 is oscillated, so that a clock composed of sinusoidal voltages having opposite phases is generated at each of the clock input terminal 1 and clock output terminal 2 as shown in FIG. 9(B). Since the switch 11 is on, the driving ability of the oscillator circuit becomes large, combined with the outputs from the NAND circuits 3 and 4, so that the oscillating operation is surely obtained and stabilized in a short period of time. The oscillating frequency of the clock is determined by the oscillating characteristic of the ceramic resonator 311.

After initiating the oscillating operation, the frequency divider 5 continues to divide the frequency of the inputted clock one after another by means of half frequency dividers 101 to 109. If it is assumed that the clock frequency at the clock output terminal 2 is $f_{out}$, the frequency $f_2$ of a divided frequency clock outputted from the half frequency divider circuit 101 becomes $f_{out}/2$ and the frequency $f_8$ of a divided frequency clock outputted from the half frequency divider circuit 103 becomes $f_{out}/8$. Since the output a from the flip-flop 8 is at the H level and the content of the select bit 20 is at the L level, a transfer gate 161 of the selector 6 is turned on and a transfer gate 162 thereof is turned off, so that a divided frequency clock $f_{512}$ outputted from the half frequency divider circuit 109 is selected, as shown in FIG. 9(G), to be inputted to the counter 7 through a buffer 163.

In the reset state, the counter 7 is always reset to "0" ($000_{16}$) and initiates the counting of the divided frequency clock $f_{512}$ after reset cancellation. The counter 7 also serves as a supervisory timer (watch dog timer) for detecting a run away of the CPU and outputting an interrupt signal, except for the period duping which oscillation is stable, that is, the period during which the oscillating operation, which will be described later, is at a halt and except for the period from the initiation of the oscillating operation to the initiation of the supply of the internal clock.

Since the output a from the flip-flop 8 is at the H level, the AND circuit 10 is brought into the active state and supplies the clock, outputted to the clock output terminal 2, to a specified circuit such as the CPU (not shown) as the internal clock i shown in FIG. 9(D). The microprocessor can be arranged so that a divided frequency clock x, having the same frequency as that of the divided frequency clock $f_2$ outputted from the half frequency divider circuit 101 of FIG. 2, is inputted to the AND circuit 10, instead of the clock from the clock output terminal 2.

After reset is canceled at the time $t_0$, the CPU in the microcomputer is activated by the internal clock i so as to execute a specified program. The counter 7 counts up from the initial value $000_{16}$, as described above, and if the counted value reaches a specified value and causes an over flow, it outputs an over flow signal f. In the case where the counter 7 is used as a supervisory timer (watch dog timer) for the CPU, a non-maskable interrupt is caused by the over flow signal, so that, before the over flow of the counted value occurs, the program resets the counter 7 so as to prevent the non-maskable interrupt, thus returning the counted value to the initial value $000_{16}$.

The counter 7 is reset in response to the reset signal RST, a write signal WRT to the counter 7, and the over flow signal f by a reset control circuit 170 shown in FIG. 2. The select bit 20 is for selecting either of the divided frequency clocks $f_{32}$ and $f_{512}$ so that the selected one is counted by the counter 7. If the divided frequency clock $f_{512}$ was selected after the generation of the reset signal RST, the divided frequency clock $f_{32}$ is selected by writing "1" in the select bit 20.

After the reset signal RST is thus generated, the select bit 21 is reset to "0" as shown in FIG. 9(I), so that its content s shifts to the L level. On the other hand, the flip-flop 8 is set so that its output a shifts to the H level. Consequently, the output sa from the AND circuit 13 shifts to the L level, thereby turning the switch 11 on, so that the driving ability of the oscillator circuit becomes large as shown in FIG. 9(K).

If the oscillation stop signal STP is generated at a time $t_1$, the output p from the flip-flop 9 shifts to the L level, so that the NAND circuits 3 and 4 remain in the active state, thereby stopping the oscillating operation. On the other hand, the output a from the flip-flop 8 shifts to the L level, while the output from the OR circuit 14 shifts to the H level, so that the selector 6 selects the divided frequency clock $f_{32}$, as shown in FIG. 9(G). Since the output a shifts to the L level, the AND circuit 10 is brought into the inactive state, so that the supply of the internal clock i is stopped, as shown in FIG. 9(D).

When the interrupt signal INT is generated at a time $t_2$ thereafter, the output p shifts to the H level and the NAND circuits 3 and 4 are brought into the active state, so that the oscillating operation is initiated, as shown in FIG. 9(B), and the clock is generated. The resulting clock is inputted to the frequency divider 5. After the counter 7 counts the divided frequency clock $f_{32}$ selected by the selector 6 and outputs the over flow signal f, as shown in FIG. 9(H), the flip-flop 8 is set and the AND circuit 10 is brought into the active state, so that the supply of the internal clock i is initiated at a time $t_3$, as shown in FIG. 9(D).

Next, when the CPU writes "1" in the select bit 21 at a time $t_4$, as shown in FIG. 9(I), the output sa from the AND circuit 13 shifts to the H level, as shown in FIG. 9(J), thereby turning off the switch 11, so that the NAND circuit 4 is cut off. Consequently, the driving ability of the oscillator circuit becomes small, so that oscillation will continue by consuming less power. Next, when the CPU writes "1" in the select bit 20 at a time $t_5$, as shown in FIG. 9(E), the output from the OR circuit 14 shifts to the H level so that the selector 6 selects the divided frequency clock $f_{32}$, which is then supplied to the CPU as the internal clock i.

Thus, if the oscillation stop signal STP is generated at a time $t_7$ with the driving ability of the oscillator circuit being smaller, the oscillating operation is stopped, similarly to the operation at the time $t_1$, so that the supply of the internal clock i is stopped. The generation of the oscillation stop signal STP switches the output a from the flip-flop 8 and the output sa from the AND circuit 13 to the L level and turns the switch 11 on, so that the driving ability becomes large. If the interrupt signal INT is generated at a time $t_8$ subsequently, the oscillating operation is initiated with the driving ability being large, similarly to the operation at the time $t_2$. If the over flow signal is outputted from the counter 7, similarly to the case at the time $t_3$, the output a from the flip-flop 8 shifts to the H level and the output sa from the AND circuit 13 shifts to the H level, thereby turning the switch 11 off, so that the driving ability becomes small as shown in FIG. 9(K). Next, when the oscillation stop signal STP is generated at a time $t_{12}$, the driving ability becomes larger, similarly to the case at the time $t_7$.

Thus, if "1" is written in the select bit 21 only once after the generation of the reset signal RST, the driving ability of the oscillator circuit becomes large upon the generation of the oscillation stop signal STP and small upon the outputting of the over flow signal f. Therefore, the oscillating operation can surely be initiated as well as the consumed current can be reduced after the supply of the internal clock. Hence, it is no more necessary to write "1" in the select bit 21 prior to the generation of every oscillation stop signal STP, which was needed by the conventional embodiment. Accordingly, the program to be executed by the CPU is not complicated. Moreover, since the write instruction is not written in the program, there is no possibility that the oscillating operation is not performed due to miswriting.

Figure 10:
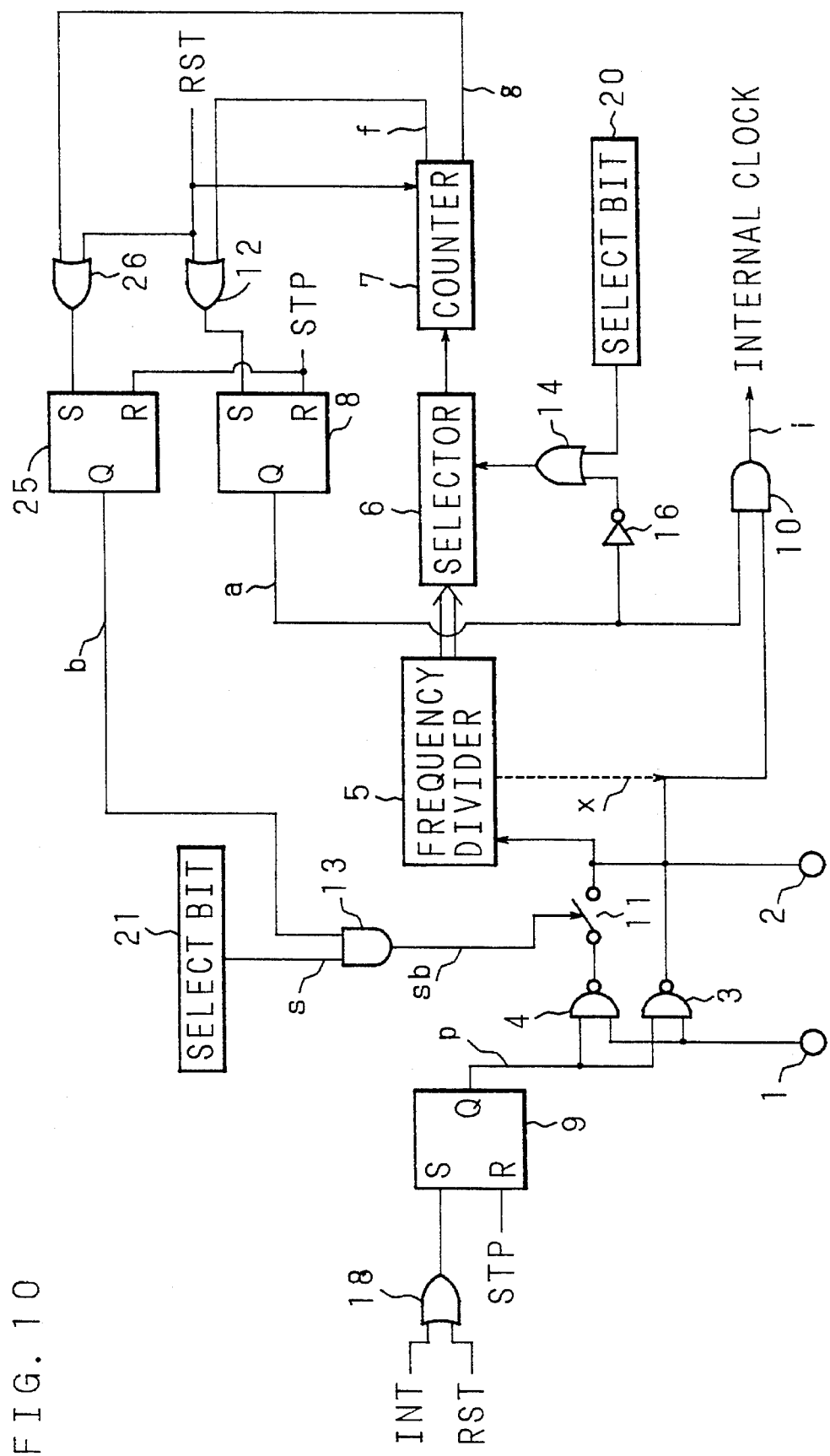
FIG. 10 is a block diagram showing the constitution of another embodiment of the main portion of the microcomputer according to the present invention.

FIG. 10 is a block diagram showing a main portion of another embodiment of the microcomputer according to the present invention, which is arranged so that the counter 7 outputs an output signal g (see FIG. 2) before outputting the over flow signal f. The output signal g is inputted to one input terminal of an OR circuit 26. To the other input terminal of the OR circuit 26 inputted is the reset signal RST. The output terminal of the OR circuit 26 is connected to the set terminal S of an RS flip-flop 25. The reset terminal R of the flip-flop 25 is connected to the reset terminal R of the flip-flop 8. The output terminal Q of the flip-flop 25 is connected to one input terminal of the AND circuit 13. As for the other components, they are the same as those of the microcomputer shown in FIG. 8, so that the same numerals designate the same components in the drawings.

Figure 11:
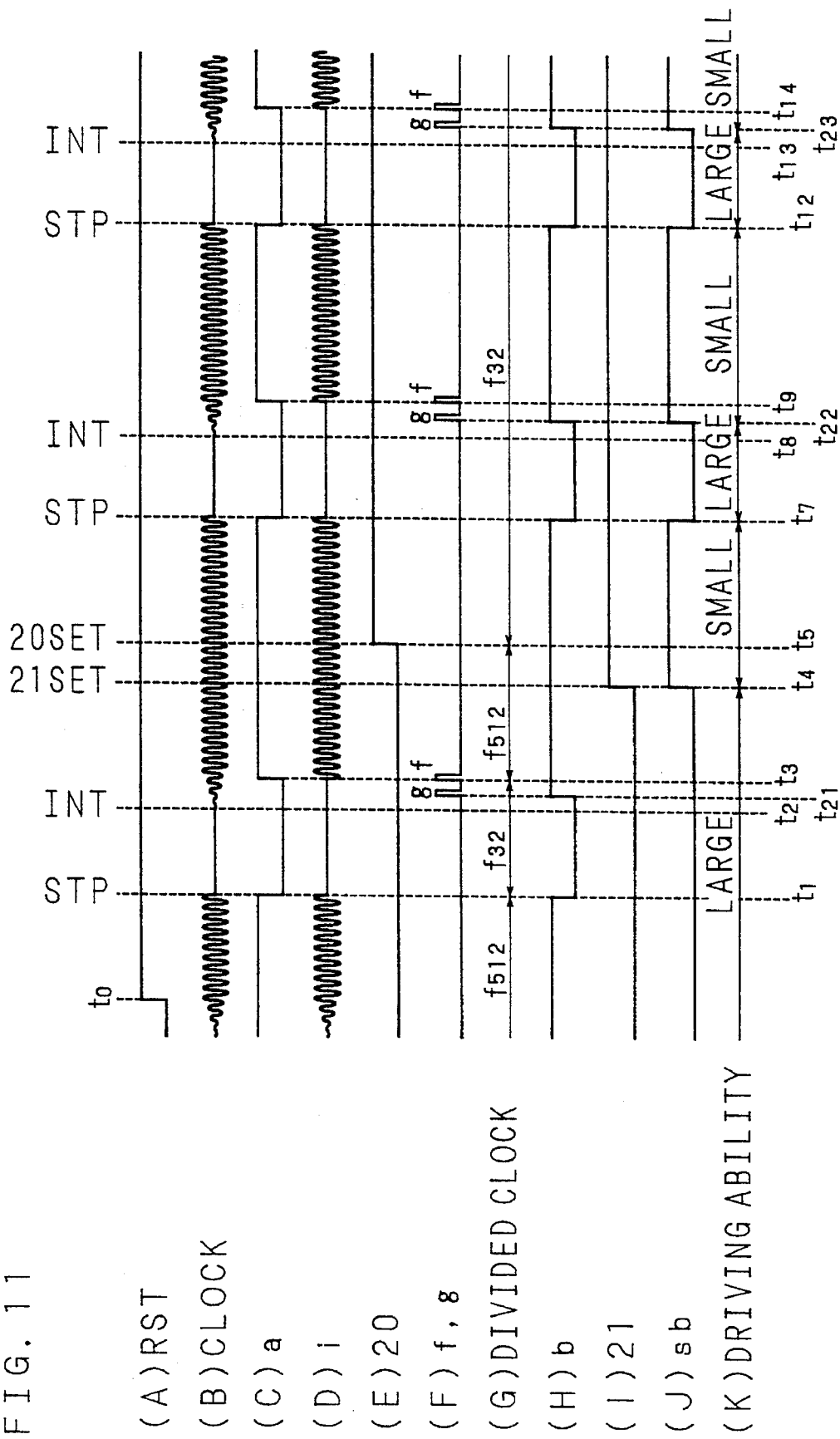
FIG. 11 is a timing chart of signals to individual parts.

Next, a description will be given to the operation of the microcomputer with reference to FIG. 11 which shows a timing chart of signals to individual parts. The operation of the microcomputer is the same as that of the microcomputer shown in FIG. 8, except that the output signal g is outputted from the counter 7 between the times $t_1$ to $t_5$, so that the output b from the flip-flop 25 shifts to the H level as shown in FIG. 11(H).

When the oscillation stop signal STP is generated at the time $t_7$, the output terminal Q of the flip-flop 9 shifts to the L level and the outputs from the NAND circuits 3 and 4 are fixed to the H level, so that the oscillating operation is stopped as shown in FIG. 11(B). Moreover, the output a from the flip-flop 8 shifts to the L level, so that the supply of the internal clock i is stopped, as shown in FIG. 11(D). Furthermore, the output b from the flip-flop 25 shifts to the L level and the output sb from the AND circuit 13 shifts to the L level, thereby turning on the switch 11. Consequently, the driving ability of the oscillator circuit becomes large as shown in FIG. 11(K).

If the interrupt signal INT is generated at a time $t_8$ thereafter, the output p from the flip-flop 9 shifts to the H level and the NAND circuits 3 and 4 are brought into the active level, so that the oscillating operation is initiated as shown in FIG. 11(B). At this point, since the output a is at the L level and the output from the OR circuit 14 shifts to the H level, the selector 6 selects the divided frequency clock $f_{32}$. The counter 7 then initiates the counting of the divided frequency clock $f_{32}$ and outputs the output signal g at a time $t_{22}$ before outputting the over flow signal f. Consequently, the output b from the flip-flop 25 shifts to the H level, as shown in FIG. 11(H), and the output sb of the AND circuit 13 shifts to the H level, as shown in FIG. 11(J), thereby turning the switch 11 off, so that the driving ability of the oscillator circuit becomes small. After that, the counter 7 outputs the over flow signal f at the time $t_9$, as shown in FIG. 11(F), so that the output a from the flip-flop 8 shifts to the H level, thereby initiating the supply of the internal clock i, as shown in FIG. 11(D).

Thus, even when the operation of turning the switch 11 on or off causes a noise in the clock in the NAND circuit 4, the supply of the internal clock i is not initiated at the time when the noise arises, so that the supply of the internal clock i with the noise is prevented in advance. Although the output b from the flip-flop 25 is obtained by inputting the output signal g from the counter 7 to the flip-flop 25, it is possible to use the output a from the flip-flop 8 in place of the output b and obtain the output a by delaying, e.g., the divided frequency clock $f_2$ having a high frequency by means of a delay circuit.

In an applied system using such a microcomputer, there is a case in which the clock is generated in a device other than the microcomputer internally provided with the oscillator circuit and the resulting clock is inputted to the clock input terminal 1. In this case, since the clock is supplied from the outside, it is sufficient for the oscillator circuit part 50 to have an extremely small driving ability, compared with the case in which the oscillator circuit part 50 performs the oscillating operation for itself. A smaller driving ability is advantageous because it consumes less current. Hence, another constitution is also possible in which an extremely small driving ability is available in addition to the above large and small driving abilities of the oscillator circuit.

Figure 12:
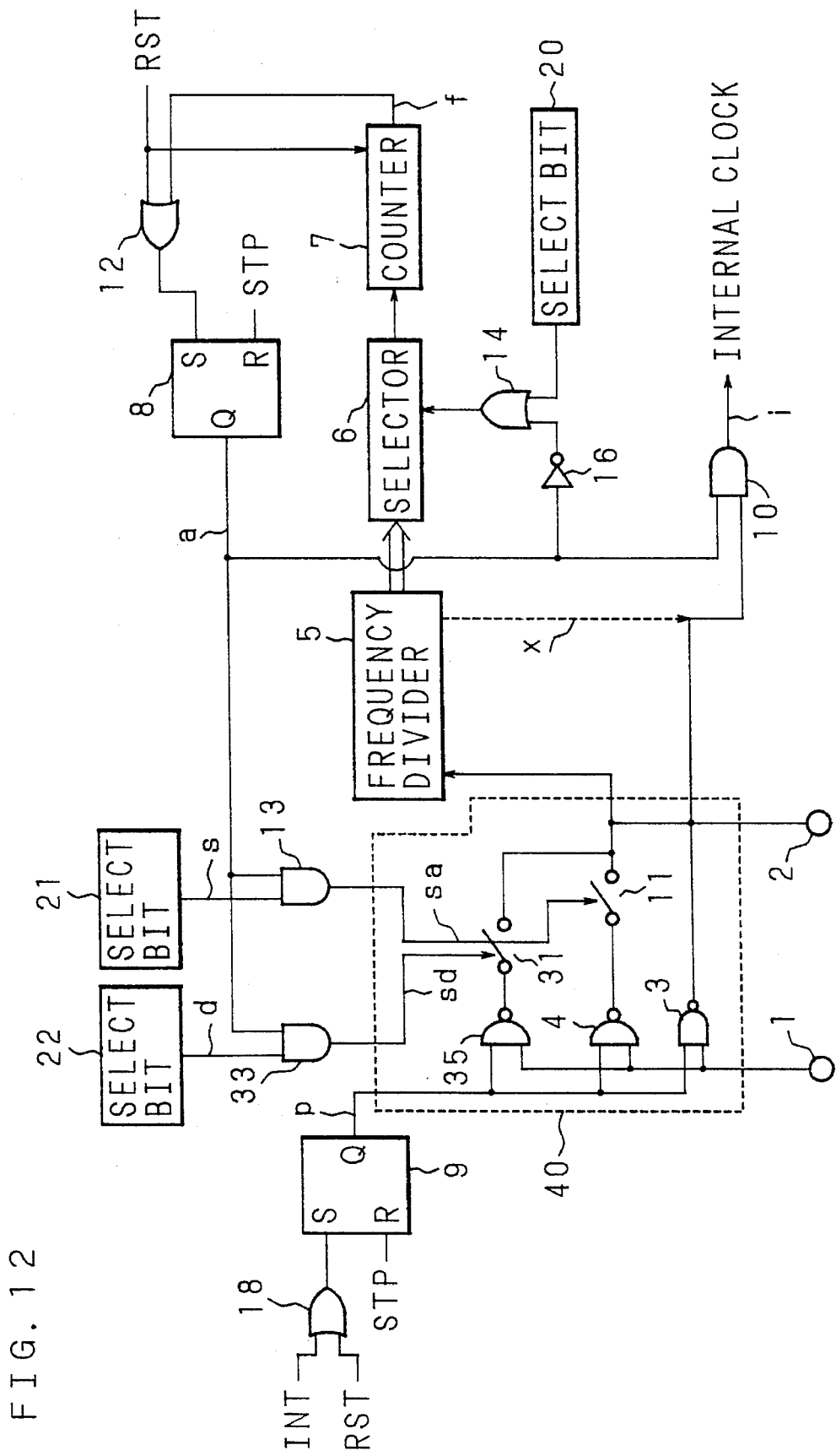
FIG. 12 is a block diagram showing the constitution of still another embodiment of the main portion of the microcomputer according to the present invention.

FIG. 12 is a block diagram showing the constitution of a main portion of another embodiment of the microcomputer in which the driving ability of the oscillator circuit can be selected from among the large, small, and extremely small ones. The output terminal Q of the flip-flop 9 is connected to one input terminal of a NAND circuit 35. The other input terminal of the NAND circuit 35 is connected in common to the clock input terminal 1. The output terminal of the NAND circuit 35 is connected via a switch 31 to the input side of the frequency divider 5 and to the clock output terminal 2. A select bit 22, in which data on selecting the driving ability is written by the CPU (not shown), is connected to one input terminal of an AND circuit 33. The other input terminal of the AND circuit 33 is connected to the output terminal Q of the flip-flop 8. The output sd from the AND circuit 33 is given to the switch 31 as an on-off control signal for the switch 31.

The driving ability of the NAND circuit 3 is extremely small, compared with those of the NAND circuit 4 and 35. If a ceramic resonator is connected between the clock input terminal 1 and clock output terminal 2, the driving ability becomes so small that stable oscillation cannot be expected. As for the other components, they are the same as those of the microcomputer shown in FIG. 8, so that the same reference numerals designate the same components in the drawings.

Figure 13:
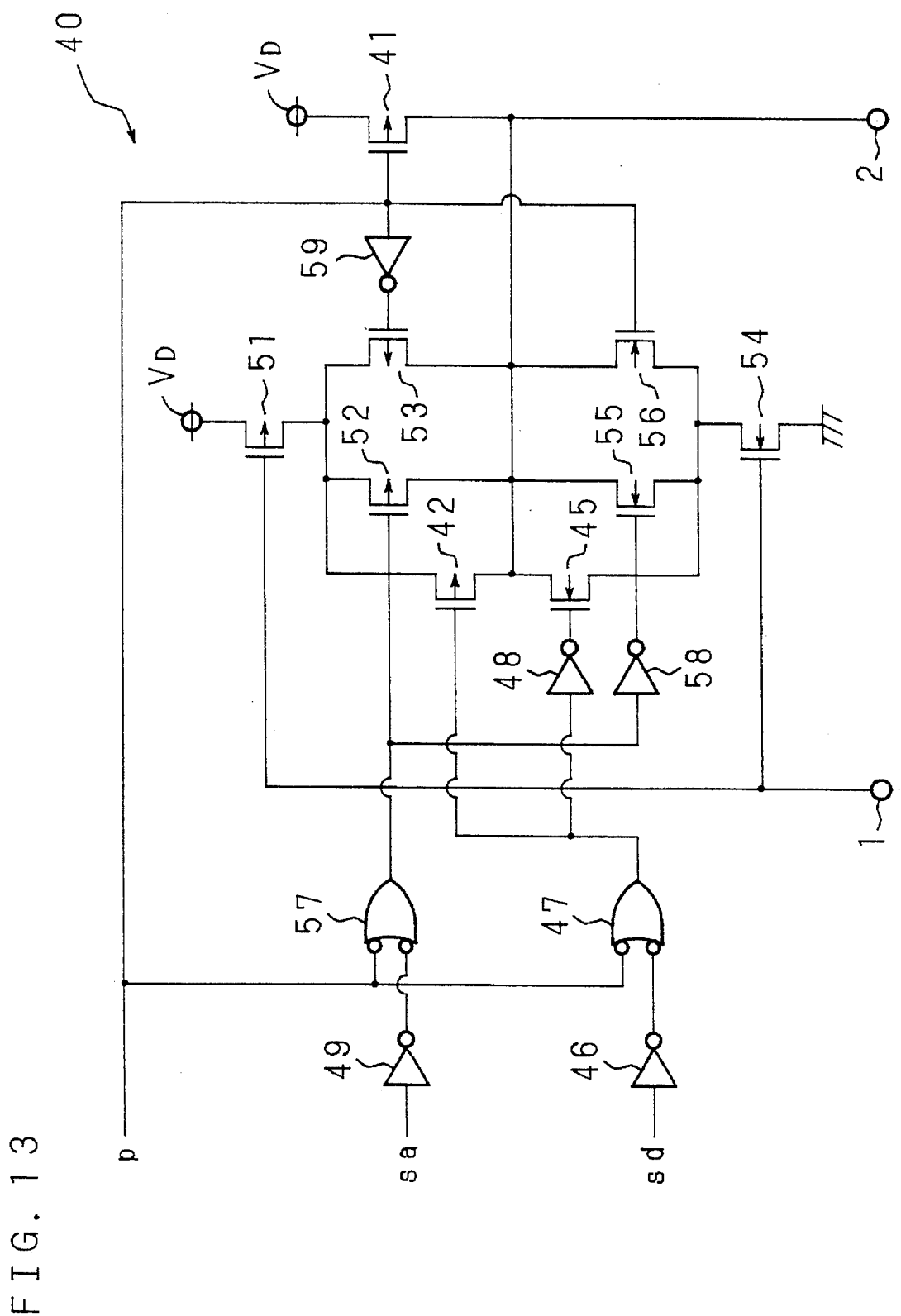
FIG. 13 is a block diagram showing a specific constitution of the oscillator circuit part.

FIG. 13 is a block diagram showing a specific constitution of an oscillator circuit part 40 of FIG. 12. The output p from the flip-flop 9 is inputted to one input terminal of each of NOR circuits 57 and 47, to the gate of a P-channel transistor 41, to the gate of an N-channel transistor 56, and to an inverter 59. The output terminal of the inverter 59 is connected to the gate of a P-channel transistor 53. The output sa from the AND circuit 13 is inputted to the other input terminal of the NOR circuit 57 via an inverter 49. The output sd from the AND circuit 33 is inputted to the other input terminal of the NOR circuit 47 via an inverter 46.

The output terminal of the NOR circuit 57 is connected to the gate of a P-channel transistor 52 and to the gate of an N-channel transistor 45 via an inverter 58. The output terminal of the NOR circuit 47 is connected to the gate of a P-channel transistor 42 and to the gate of the N-channel transistor 45 via an inverter 48. A series circuit consisting of the P-channel transistor 42 and N-channel transistor 45, a series circuit consisting of the P-channel transistor 52 and N-channel transistor 55, and a series circuit consisting of the P-channel transistor 53 and N-channel transistor 56 are connected in parallel. One terminal of the parallel circuit is connected to a direct-current source $V_D$ via a P-channel transistor 51 and the other terminal thereof is grounded via a N-channel transistor 54. The gate of the P-channel transistor 51 and the gate of the N-channel transistor 54 are connected to the clock input terminal 1. The direct-current source $V_D$ is connected to the clock output terminal 2 via the P-channel transistor 41.

Below, a description will be given to the operation of the microcomputer thus constituted. The driving ability of the oscillator circuit is changed by controlling the switches 11 and 31 so that they are turned on or off based on the contents of the select bits 21 and 22, respectively. Apart from that, the operation of the microcomputer is the same as that of the microcomputer shown in FIG. 8. The driving ability of the oscillator circuit can be changed by, e.g., writing "1" or "0" in the select bits 21 and 22, as shown in Table 1.

TABLE 1

| SELECT BIT | | NAND CIRCUIT TO BE | DRIVING |
|---|---|---|---|
| 21 | 22 | ACTIVATED | ABILITY |
| 0 | 0 | 3, 4, 35 | 100% |
| 0 | 1 | 3, 4 | 60% |
| 1 | 0 | 3, 35 | 45% |
| 1 | 1 | 3 | 5% |

DRIVING ABILITY OF NAND CIRCUIT 35: 40%
DRIVING ABILITY OF NAND CIRCUIT 4: 55%
DRIVING ABILITY OF NAND CIRCUIT 3: 5%

For example, if "1" is written in each of the select bits 21 and 22, the driving ability becomes minimum at 5%. If the external clock is to be inputted to the clock input terminal 1, the driving ability can be extremely small, so that the consumed current can be minimized.

Figure 14:
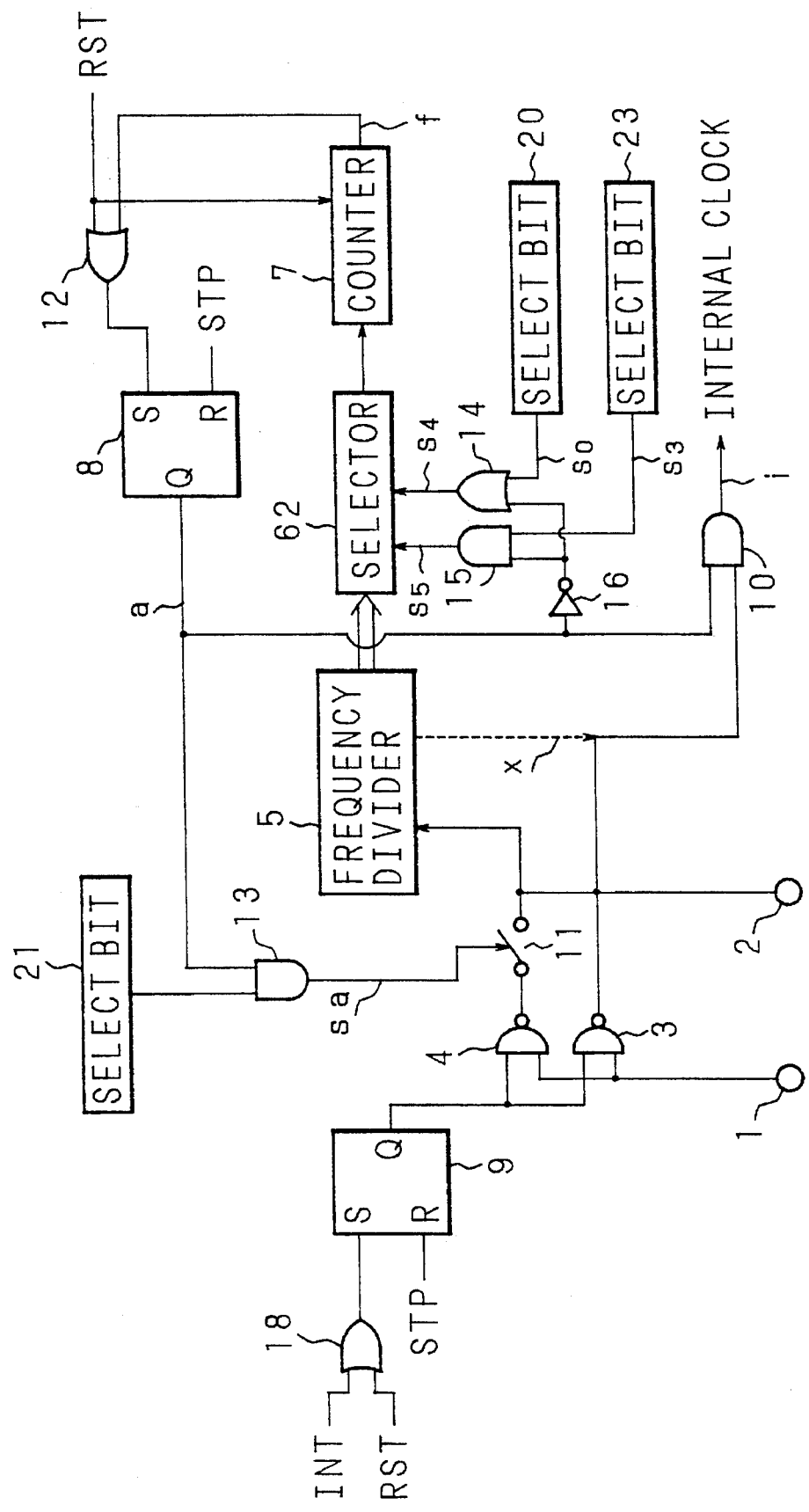
FIG. 14 is a block diagram showing the constitution of still another embodiment of the main portion of the microcomputer according to the present invention.

FIG. 14 is a block diagram showing a main portion of another embodiment of the microcomputer according to the present invention. The microcomputer has a select bit 23 serving as a clock selecting means to which data on selecting a divided frequency clock when the oscillating operation is stopped can be written and a selector 62 which can provide the data. The select bit 23 is connected to one input terminal of an AND circuit 15. The other input terminal of the AND circuit 15 is connected to the output side of the inverter 16. The output $s_5$ from the AND circuit 15 is given to the selector 62. As for the other components, they are the same as those of the microcomputer shown in FIG. 8, so that the same reference numerals designate the same components in the drawings.

Figure 15:
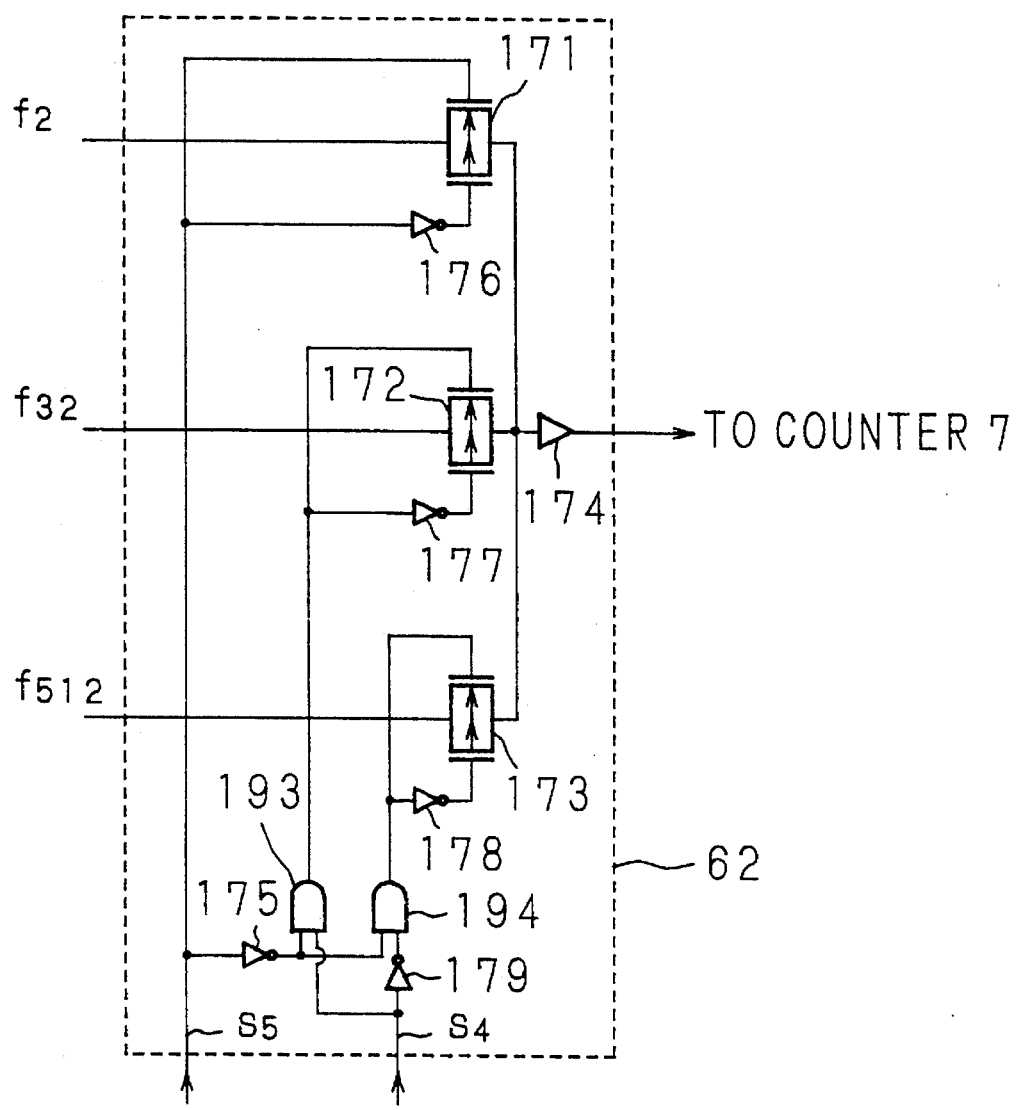
FIG. 15 is a block diagram showing a specific constitution of a selector.

FIG. 15 is a block diagram showing a specific constitution of the selector 62. The divided frequency clock $f_2$ (see FIG. 2) inputted from the frequency divider 5 is inputted to a buffer 174 via a transfer gate 171. The divided frequency clock $f_{32}$ is inputted to the buffer 174 via a transfer gate 172. The divided frequency clock $f_{512}$ is inputted to the buffer 174 via a transfer gate 173. The divided frequency clock outputted from the buffer 174 is inputted to the counter 7 (See FIG. 14).

The output $s_5$ from the AND circuit 15 shown in FIG. 14 is inputted to the gate of an N-channel transistor in the transfer gate 171, to the gate of a P-channel transistor in the transfer gate 171 via an inverter 176, and to one input terminal of each of AND circuits 193 and 194 via all inverter 175. The output $s_4$ from the OR circuit 14 is inputted to the other input terminal of an AND circuit 193 and to the other input terminal of an AND circuit 194 via an inverter 179. The output from the AND circuit 193 is inputted to the gate of an N-channel transistor in the transfer gate 172 and to the gate of a P-channel transistor in the transfer gate 172 via an inverter 177. The output from the AND circuit 194 is inputted to the gate of an N-channel transistor in the transfer gate 173 and to the gate of a P-channel transistor in the transfer gate 173 via an inverter 178.

Below, a description will be given to the operation of the microcomputer thus constituted with reference to FIG. 9 which shows a timing chart of signals to individual parts. As shown in FIG. 9(H), after the over flow signal f is outputted at the time $t_9$, the CPU writes "1" in the select bit 23 at a time $t_{11}$ as shown in FIG. 9(F), so that the content $s_3$ of the select bit 23 shifts to the H level. Subsequently, if the oscillation stop signal STP is generated at a time $t_{12}$, the output p from the flip-flop 9 shifts to the L level, the oscillating operation is stopped as described above and the output a from the flip-flop 8 shifts to the L level, while the output $s_5$ from the AND circuit 15 shifts to the H level, thereby turning the transfer gate 171 (see FIG. 15) on and turning the other transfer gates 172 and 173 off, so that the selector 62 selects the divided frequency clock $f_2$ which has a high frequency.

Next, when the interrupt signal INT is generated at a time $t_{13}$, the oscillator circuit initiates the oscillating operation in the manner described above. The counter 7 then initiates the counting of the divided frequency clock $f_2$. When the over flow signal f is outputted from the counter 7 at a time $t_{14}$, the output a from the flip-flop 8 shifts to the H level, thereby turning the switch 11 off, so that the driving ability of the oscillator circuit becomes small and the supply of the internal clock i is initiated. As a result, the frequency of the divided frequency clock to be counted becomes sixteen times as high as that in the case where "0" is written in the select bits 23. Since the frequency becomes higher, the over flow signal f is outputted earlier accordingly, so that the time that has elapsed till the initiation of the supply of the internal clock i can be reduced. In other words, it becomes possible to return the CPU from the operation stopped state in a shorter period of time (see $t_{13}$ to $t_{14}$ in FIG. 9).

That is, in the case of returning from the oscillation stopped state in the microcomputer shown in FIG. 8, the divided frequency clock $f_{32}$ is selected to be counted by the counter 7 for measuring the time period from the resumption of oscillation to the stabilization of oscillation. In the case where the external clock is inputted, however, it is not necessary to measure the time period that has elapsed till the oscillation by the oscillator is stabilized, for the clock is stable at the time when the clock is inputted. By not selecting the divided frequency clock $f_{32}$ but selecting a divided frequency clock having a higher frequency to be counted, the supply of the internal clock can be resumed in an extremely short period of time. Hence, in the case where the additional select bit 23 is provided and the external clock is inputted, the internal clock i can be supplied slightly later than the inputting of the external clock by writing "1" in the select bit 23, so that the time at which the CPU is activated can be advanced.

Figure 16:
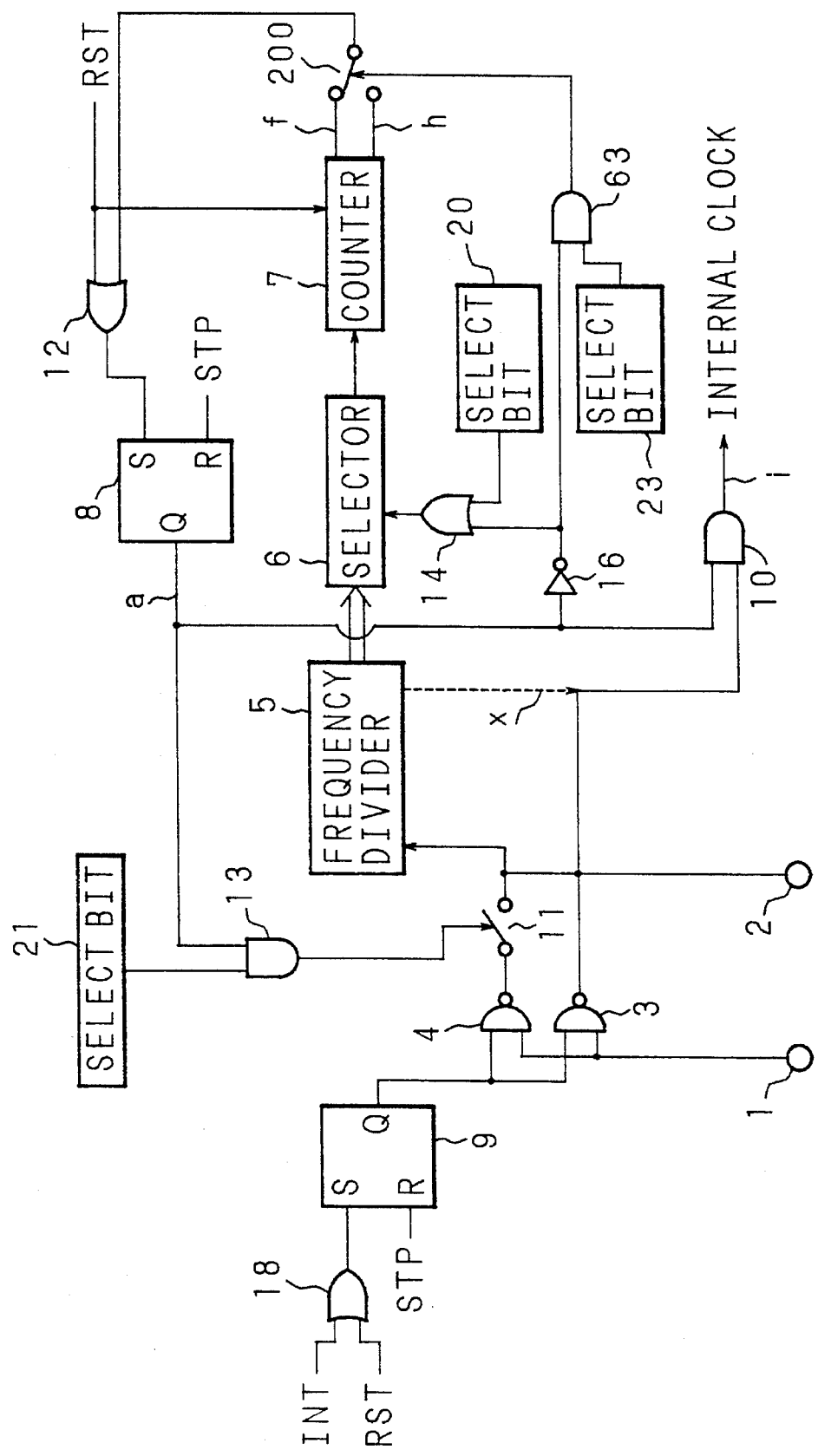
FIG. 16 is a block diagram showing the constitution of still another embodiment of the main portion of the microcomputer according to the present invention.

The constitution shown in FIG. 16 also enables the CPU to achieve a fast return from the operation stopped state.

The microcomputer shown in FIG. 16 is provided with a selector switch 200 for selecting either the over flow signal f outputted from the counter 7 or an output signal h outputted prior to the outputting of the over flow signal f. The signal selected is inputted to one input terminal of an OR circuit 12. The select bit 23 is connected to one input terminal of an AND circuit 63. The other input terminal of the AND circuit 63 is connected to the joint between one input terminal of the OR circuit 14 and the inverter 16. The output from the AND circuit 63 is given to the selector switch 200 as a select control signal. As for the other components, they are the same as those of the microcomputer shown in FIG. 8, so that the same reference numeral designate the same components in the drawings.

Below, a description will be given to the operation of the microcomputer. Here, the counter 7 outputs, in addition to the over flow signal f, the output signal h from, e.g., a frequency divider circuit 202, which is close to the first stage of the counter 7 shown in FIG. 2, which is constituted by the frequency divider circuits 201, 202 . . . 211, 212. Since the output signal h counts a divided frequency clock having a high frequency, the counted value reaches a specified value fast to be outputted earlier than the over flow signal f, so that the time that has elapsed till the supply of the internal clock i is initiated can be reduced if the selector switch 200 selects the output signal h.

Since the output a from the flip-flop 8 remains at the L level during the period from the outputting of the oscillating operation stop signal STP to the outputting of the over flow signal f, the output from the AND circuit 63 shifts to the H level, so that the selector switch 200 is switched to select the output signal h. Consequently, if the output signal h is outputted, the output a from the flip-flop 8 shifts to the H level and hence the supply of the internal clock i can be initiated earlier, so that the CPU can make a return from the operation stopped state in a short period of time.

Figure 17:
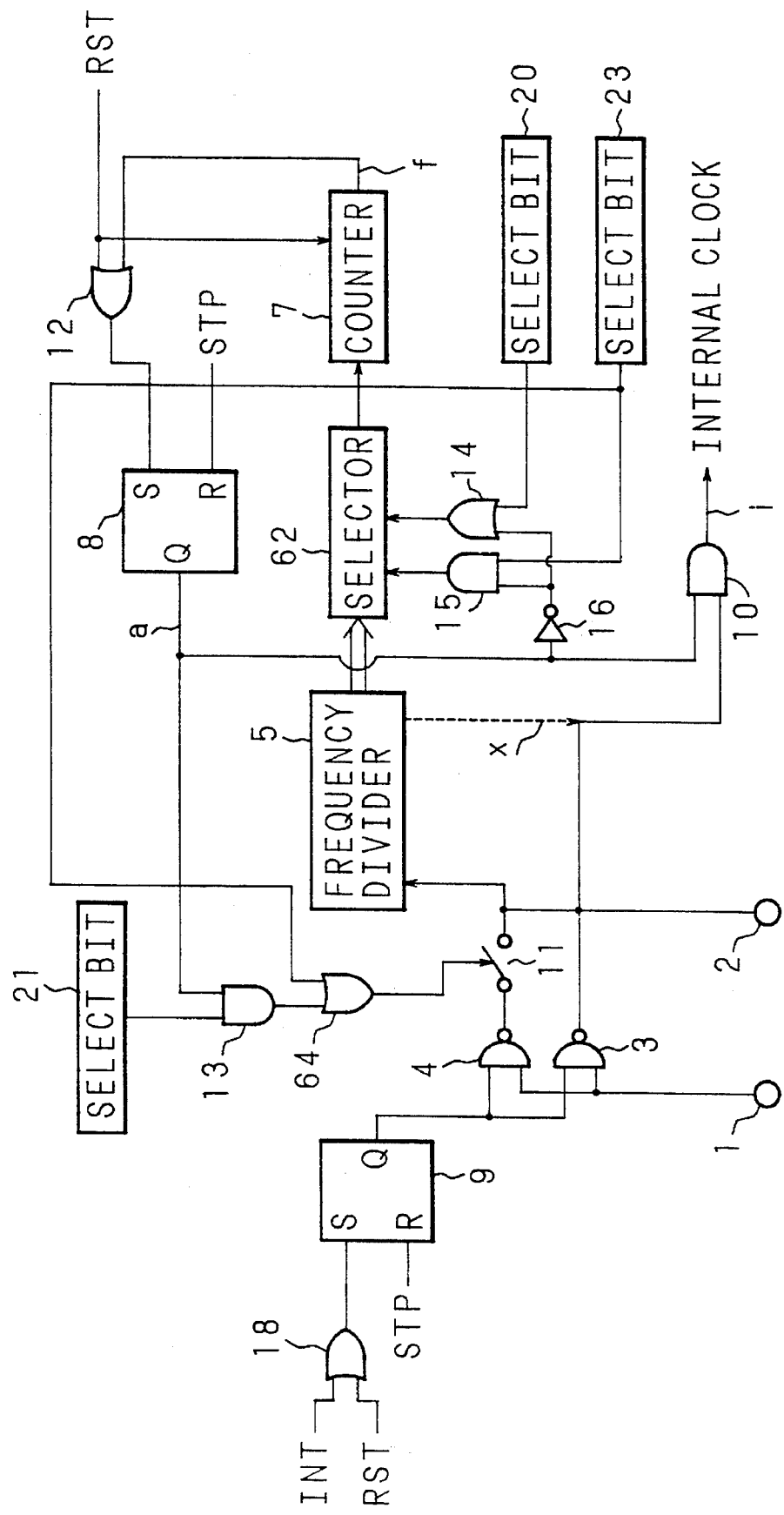
FIG. 17 is a block diagram showing the constitution of still another embodiment of the main portion of the microcomputer according to the present invention.

FIG. 17 is a block diagram showing the constitution of a main portion of still another embodiment of the microcomputer according to the present invention. The output terminal of the AND circuit 13 is connected to one input terminal of an OR circuit 64. The other input terminal of the OR circuit 64 is connected to the select bit 23. The output from the OR circuit 64 is given to the switch 11 as an on-off control signal for the switch 11. As for the other components, they are the same as those of the microcomputer shown in FIG. 14, so that the same reference numerals designate the same components in the drawings.

In the microcomputer, with "1" written in the select bit 23, the selector 62 selects the divided frequency clock $f_2$ having a high frequency so as to output the over flow signal at an early stage, thereby advancing the time at which the supply of the internal clock i is initiated. Moreover, the output from the OR circuit 64 shifts to the H level in accordance with the content of the select bit 23, thereby turning off the switch 11, so that the driving ability of the oscillator circuit becomes small. In this case, by writing "1" in the select bit 23 only once, there can be obtained two functions of: reducing the time period that has elapsed till the initiation of the supply of the internal clock; and rendering the driving ability of the oscillator circuit small. Hence, even when the external clock is inputted, the microcomputer can operate properly without an additional select bit.

Thus far, the present embodiment has described the case in which a common register bit as shown in FIG. 5 is used as the select bit 23 in which data on selecting a divided frequency clock to be inputted to and counted by the counter is written from the time at which the over flow signal is outputted, i.e., the time at which the supply of the internal clock is initiated, so that the CPU writes specified data in the register bit after the cancellation of the reset signal RST. However, it is also possible to fix data to be written in the select bits 21, 22, and 23 by hardware. This can be achieved by applying a technique termed as mask option in a microcomputer internally provided with a masked ROM.

Figure 18:
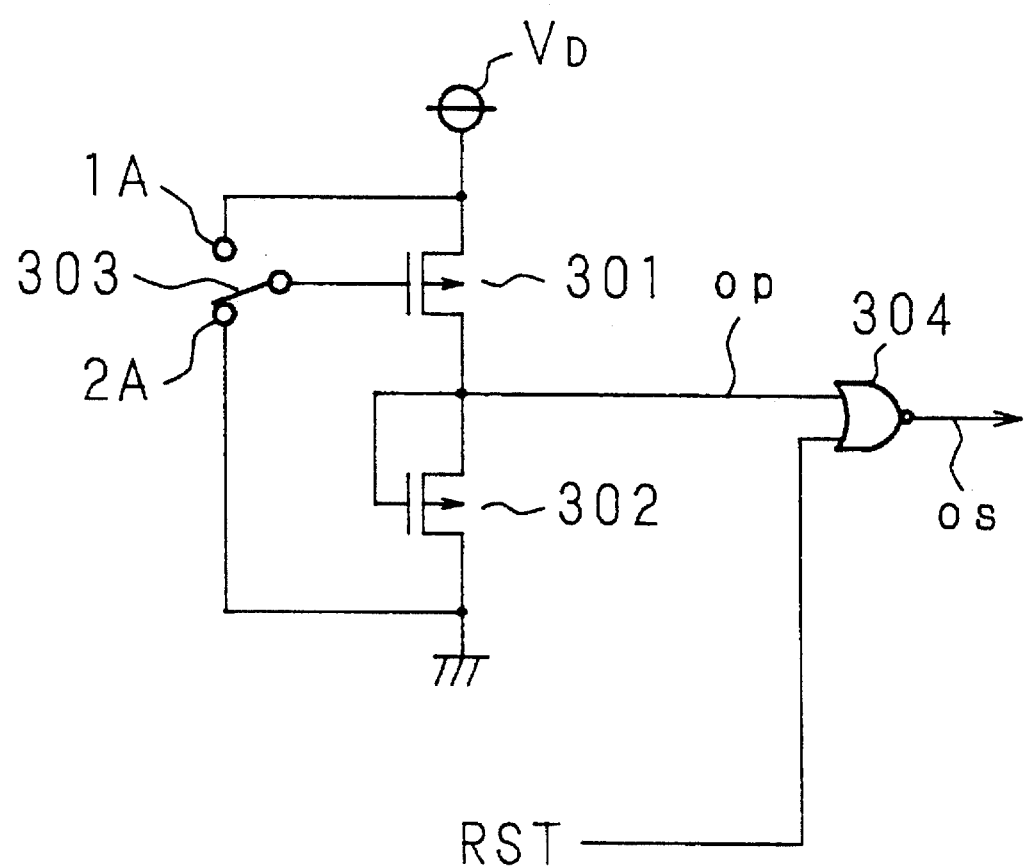
FIG. 18 is a block diagram showing a specific constitution of the select bit in the case where it is formed by mask option.

FIG. 18 is a block diagram showing the constitution of the select bit 23 to which the mask option is applied. The direct-current source $V_D$ is grounded via a series circuit consisting of a P-channel transistor 301 and a P-channel transistor 302. The gate of the P-channel transistor 301 is alternatively connected to the direct-current source $V_D$ or to the ground voltage through the switching of a switch 303. The gate of the P-channel transistor 302 is connected to the joint between the P-channel transistors 301 and 302 and to one input terminal of an NOR circuit 304. To the other input terminal of the NOR circuit 304 is inputted the reset signal RST.

The switch 303 is a selector circuit for selecting the gate potential of the P-channel transistor 301, which is connected to either a terminal 1A or a terminal 2A depending on the presence or absence of, e.g., a conductive diffusion layer, polysilicon layer, aluminum layer, and the like on a silicon substrate. The user of the microcomputer specifies the option with respect to the manufacturer or produces a mask by changing the layout pattern of the corresponding portion on the mask for manufacturing the microcomputer, whereby either of the terminals 1A and 2A is selected.

If the terminal 1A is selected by the selector switch 303, the P-channel transistor 301 is turned off, while the N-channel transistor 302 is turned on, so that the output op shifts to the L level. Conversely, if the terminal 2A is selected, the output op shifts to the H level. Since the NOR circuit 304 outputs a signal os, which is the logical OR between the output op and reset signal RST, even if the output op is at the L level, the output os from the NOR circuit 304 shifts to the L level when the reset signal RST is inputted.

In the case where the selector circuit is applied to the select bit 21, if the terminal 2A is selected, the output op shifts to the H level, while the output os from the NOR circuit 304 shifts to the L level, so that the driving ability of the oscillator circuit becomes large. On the other hand, if the terminal 1A is selected, the output os from the NOR circuit 304 shifts to the L level during the period when the reset signal RST is generated, so that the driving ability becomes large. Even if the terminal 1A is selected, the os from the NOR circuit 304 shifts to the L level during the period when the reset signal RST is not generated, so that the driving ability becomes small. Thus, if the terminal 1A is selected, the driving ability of the oscillator circuit remains large during the period when the reset signal RST is generated. Hence, if the reset signal RST is given during the period when the power source is supplied, the normal oscillating operation can be performed at the initiation of oscillation with the driving ability of the oscillator circuit being large.

Although the driving ability of the oscillator circuit becomes large upon the generation of the oscillation stop signal STP in the present embodiment as described above, the same effect can be obtained if the present embodiment is arranged so that the driving ability becomes large only after a trigger, such as an interrupt signal, is inputted in the state in which the oscillating operation is stopped, so as to induce a return from such a state.

As described above in detail, according to the present invention, the driving ability of the oscillator circuit can be automatically made large from the time when oscillating operation is stopped till the initiation of the supply of the internal clock and small at all other times, in accordance with the content of the select bit. Consequently, the CPU is not required to write data in the select bit, thereby simplifying the program.

Moreover, since it is not necessary to write in the program an instruction to write data in the select bit, there is no possibility of an unreliable oscillating operation due to miswriting, so that a problem such that the oscillating operation is not initiated can be prevented in advance. Furthermore, since the time interval between the initiation of the oscillating operation and the initiation of the supply of the internal clock is shortened compared with that in the conventional embodiment, the CPU can be activated in a shorter period of time if the external clock is inputted. In addition, the content of the select bit does not suffer a change resulting from a bug in the program, an alien noise, or the like.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A microcomputer, comprising:
    driving ability selecting means responsive to an external signal for selecting the driving ability of an oscillator generating a clock signal;
    an oscillator circuit part, said part including a driving ability changing means coupled to said selecting means for changing the driving ability of the oscillator circuit;
    count means coupled to said oscillator circuit for counting clock signal pulses;
    signal output means coupled to, and responsive to an output signal from, said count means for outputting a predetermined signal in response to said count means counting a predetermined value;
    internal clock supply means coupled to said oscillator circuit and to said signal output means for supplying an internal clock signal in response to said predetermined signal;
    a logic circuit coupled to said driving ability selecting means and to said signal output means, and responsive to a signal related to the predetermined signal and the content of said driving ability selecting means, for providing a logic circuit output signal; and
    control means coupled to said logic circuit for controlling said driving ability changing means in response to said logic circuit output signal, so that a large driving ability is obtained during the period from the initiation of oscillation to the initiation of the supply of the internal clock signal and that a driving ability in accordance with the content of said driving ability selecting means is obtained in relation to the initiation of the supply of the internal clock signal.

2. A microcomputer according to claim 1, wherein said count means counts a predetermined number of clock signal pulses and outputs a first signal and a second signal, said control means controls said driving ability changing means so that the large driving ability is obtained till the outputting of the first signal and that the driving ability in accordance with the content of said driving ability selecting means is obtained after the outputting of the second signal, and said internal clock supply means supplies the internal clock signal upon the generation of the second signal.

3. A microcomputer according to claim 1, wherein said driving ability selecting means selects from among three or more states in which the driving ability of the oscillator circuit part is different.

4. A microcomputer according to claim 3, wherein at least one state of the three of more states, from among which said driving ability selecting means selects, is a state in which the driving ability of the oscillator circuit part is so small that the oscillating operation by the oscillator circuit cannot be sustained.

5. A microcomputer according to claim 1, wherein:

said count means counts a predetermined number of clock pulses and outputs a first signal and a second signal; and said microcomputer further comprises a clock pulse selecting means coupled to said count means for selecting clock pulses to be inputted to said count means, and wherein said internal clock supply means supplies the internal clock signal in response to the second signal.

6. A microcomputer according to claim 1, further comprising:

first and second clock selecting means coupled to said count means for selecting clock pulses to be inputted to said count means; and driving ability changing means for providing, based on the content of said second clock selecting means, a driving ability of the oscillator circuit part which is so small that the oscillating operation by the oscillator circuit cannot be sustained.

7. A microcomputer according to claim 1, wherein said driving ability selecting means includes means responsive to a change in the layout pattern of one of a diffusion layer, polysilicon layer, and aluminum layer on a semiconductor substrate for setting the content of said driving ability selecting means.

8. A microcomputer according to claim 5, wherein said driving ability selecting means and/or said clock selecting means includes means responsive to a change in the layout pattern of one of a diffusion layer, polysilicon layer, and aluminum layer on a semiconductor substrate for changing the content of one of said driving ability selecting means and/or said clock selecting means.

* * * * *